United States Patent
Yun et al.

(10) Patent No.: US 11,817,387 B2
(45) Date of Patent: Nov. 14, 2023

(54) SEMICONDUCTOR DEVICE INCLUDING DUMMY PATTERNS AND PERIPHERAL INTERCONNECTION PATTERNS AT THE SAME LEVEL

(71) Applicant: SAMSUNG ELECTRONICS CO., LTD., Suwon-si (KR)

(72) Inventors: Jang-Gn Yun, Hwaseong-si (KR); Jaesun Yun, Anyang-si (KR); Joon-Sung Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/750,481

(22) Filed: May 23, 2022

(65) Prior Publication Data

US 2022/0285262 A1 Sep. 8, 2022

Related U.S. Application Data

(63) Continuation of application No. 17/060,179, filed on Oct. 1, 2020, now Pat. No. 11,342,263, which is a
(Continued)

(30) Foreign Application Priority Data

Dec. 3, 2014 (KR) ........................ 10-2014-0172283

(51) Int. Cl.
*H10B 43/40* (2023.01)
*H01L 23/528* (2006.01)
(Continued)

(52) U.S. Cl.
CPC ........ *H01L 23/528* (2013.01); *H01L 23/3192* (2013.01); *H01L 23/522* (2013.01);
(Continued)

(58) Field of Classification Search
CPC ..... H01L 27/115–11597; H01L 23/481; H01L 23/522; H01L 23/528; H01L 23/5286;
(Continued)

(56) References Cited

U.S. PATENT DOCUMENTS 6,351,406 B1  2/2002  Johnson et al.
6,528,841 B2  3/2003  Choi et al.
(Continued)

FOREIGN PATENT DOCUMENTS

JP  2013-102133   5/2013
KR  10-2007-0115848  12/2007

OTHER PUBLICATIONS

Korean Office Action Issued in Corresponding Korean Patent Application No. KR 10-2014-0172283 dated Oct. 12, 2020.
Office Action issued in corresponding U.S. Appl. No. 17/060,142 dated Feb. 23, 2021.

*Primary Examiner* — Eric A. Ward
(74) *Attorney, Agent, or Firm* — F. Chau & Associates, LLC

(57) ABSTRACT

A semiconductor device includes a cell semiconductor pattern disposed on a semiconductor substrate. A semiconductor dummy pattern is disposed on the semiconductor substrate. The semiconductor dummy pattern is co-planar with the cell semiconductor pattern. A first circuit is disposed between the semiconductor substrate and the cell semiconductor pattern. A first interconnection structure is disposed between the semiconductor substrate and the cell semiconductor pattern. A first dummy structure is disposed between the semiconductor substrate and the cell semiconductor pattern. Part of the first dummy structure is co-planar with part of the first interconnection structure. A second dummy structure not overlapping the cell semiconductor pattern is disposed on the semiconductor substrate. Part of the second dummy structure is co-planar with part of the first intercon-
(Continued)

nection structure. A conductive shielding pattern is disposed between the cell semiconductor pattern and the semiconductor substrate and above the first circuit and the first interconnection structure.

20 Claims, 18 Drawing Sheets

Related U.S. Application Data continuation of application No. 16/151,526, filed on Oct. 4, 2018, now Pat. No. 10,796,991, which is a continuation of application No. 14/957,113, filed on Dec. 2, 2015, now Pat. No. 10,115,667.

(51) Int. Cl.
    *H01L 23/31*     (2006.01)
    *H01L 27/06*     (2006.01)
    *H01L 23/522*     (2006.01)
    *H10B 43/27*     (2023.01)

(52) U.S. Cl.
    CPC ......... *H01L 27/0688* (2013.01); *H10B 43/40* (2023.02); *H01L 2924/0002* (2013.01); *H10B 43/27* (2023.02)

(58) Field of Classification Search
    CPC .............. H01L 23/3192; H01L 23/552; H01L 27/0688; H01L 2924/00; H01L 2924/002; G11C 16/28
See application file for complete search history.

(56) References Cited

U.S. PATENT DOCUMENTS

| | | | |
|---|---|---|---|
| 6,567,287 B2 | 5/2003 | Scheuerlein | |
| 6,768,151 B2 | 7/2004 | Kasai | |
| 6,906,361 B2 | 6/2005 | Zhang | |
| 7,750,334 B2 | 7/2010 | Toda | |
| 7,885,114 B2 | 2/2011 | Park et al. | |
| 7,900,177 B2 | 3/2011 | Hirabayashi | |
| 8,053,845 B2 | 11/2011 | Kwon et al. | |
| 8,178,917 B2 | 5/2012 | Tanaka et al. | |
| 8,228,816 B2 | 7/2012 | Choo | |
| 8,324,680 B2 | 12/2012 | Izumi et al. | |
| 8,338,882 B2 | 12/2012 | Tanaka et al. | |
| 9,111,592 B2 | 8/2015 | Maejima | |
| 9,502,299 B2 | 11/2016 | Hishida et al. | |
| 10,115,667 B2 | 10/2018 | Yun et al. | |
| 10,796,991 B2 | 10/2020 | Yun et al. | |
| 2010/0090286 A1 | 4/2010 | Lee et al. | |
| 2011/0121403 A1 | 5/2011 | Lee et al. | |
| 2011/0215394 A1* | 9/2011 | Komori ................. | H10B 43/27 257/E21.423 |
| 2011/0220987 A1 | 9/2011 | Tanaka et al. | |
| 2013/0248975 A1 | 9/2013 | Hishida et al. | |
| 2013/0249113 A1 | 9/2013 | Baba | |
| 2014/0043902 A1* | 2/2014 | Unno .................... | H10B 43/35 365/185.21 |
| 2015/0263024 A1* | 9/2015 | Hishida ........... | H01L 21/823437 257/329 |
| 2016/0163635 A1 | 6/2016 | Yun et al. | |
| 2019/0035725 A1 | 1/2019 | Yun et al. | |
| 2021/0020563 A1 | 1/2021 | Yun et al. | |

\* cited by examiner

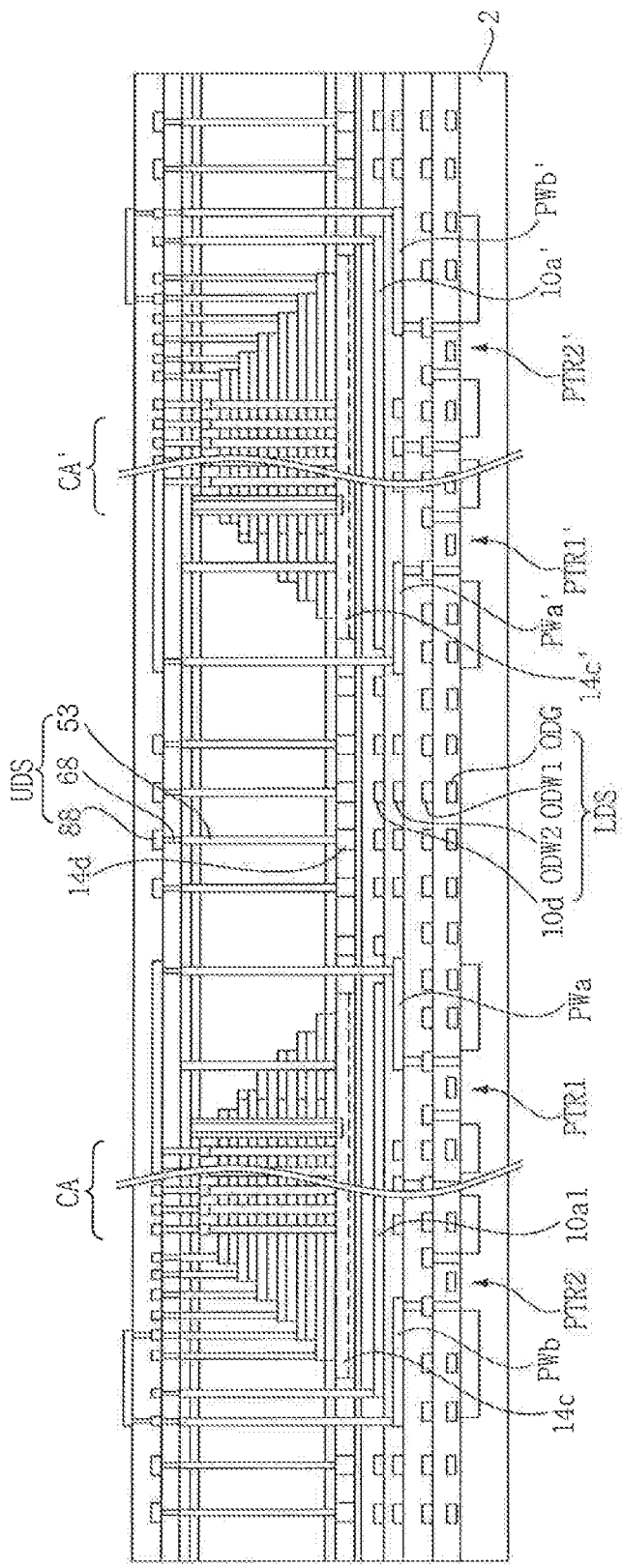

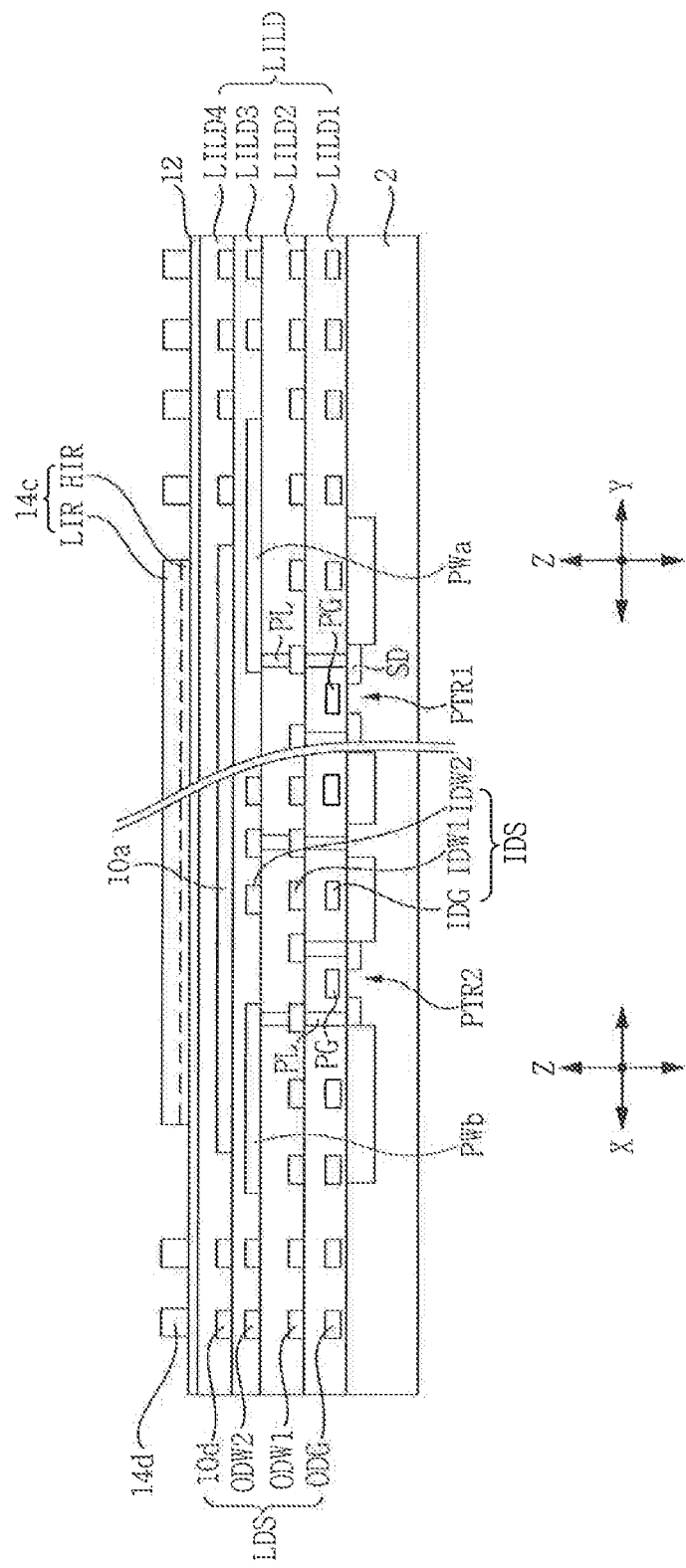

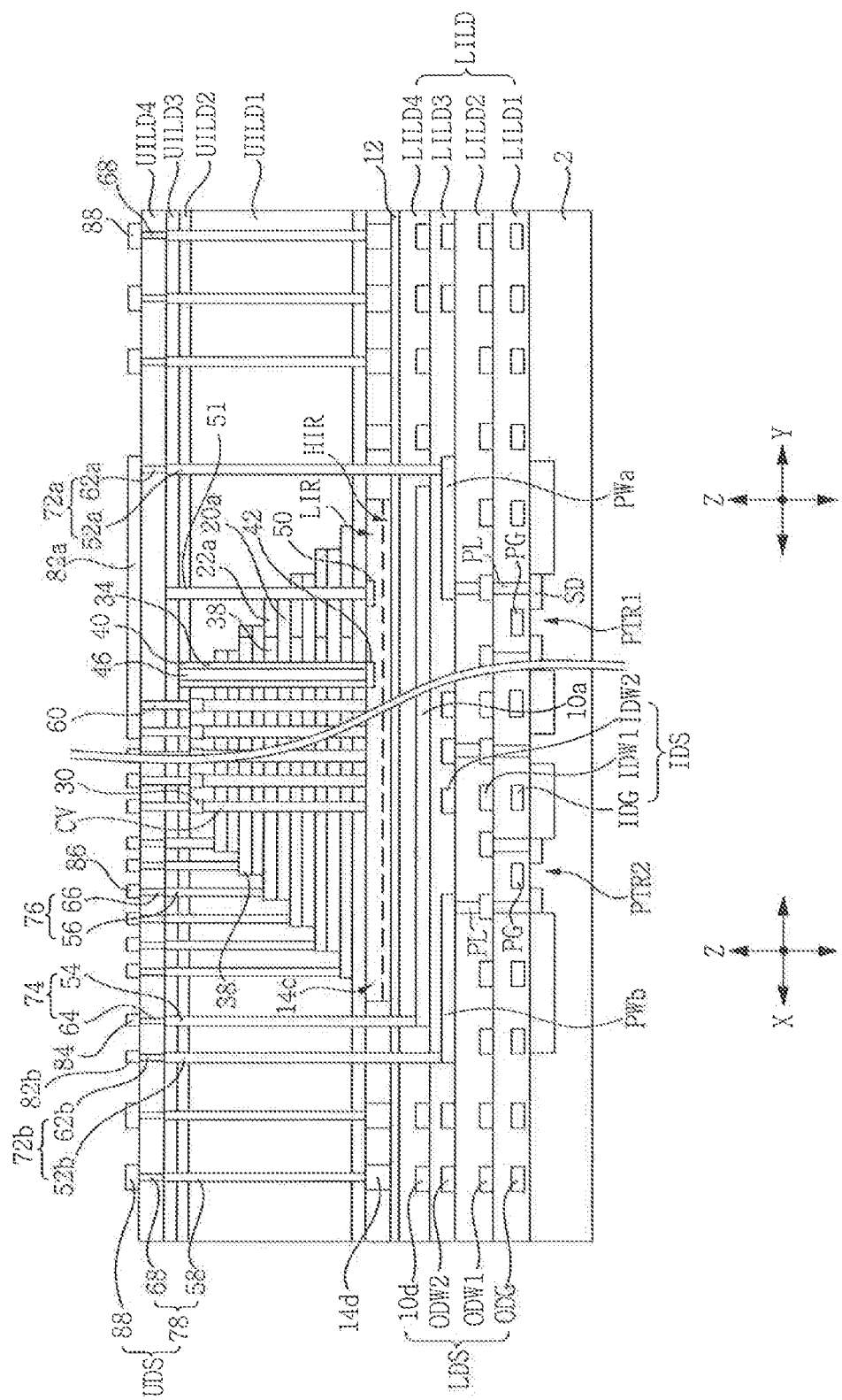

SEMICONDUCTOR DEVICE INCLUDING DUMMY PATTERNS AND PERIPHERAL INTERCONNECTION PATTERNS AT THE SAME LEVEL

CROSS-REFERENCE TO RELATED APPLICATIONS

This application is a continuation of U.S. patent application Ser. No. 17/060,179 filed on Oct. 1, 2020, which is a continuation of U.S. application Ser. No. 16/151,526 filed on Oct. 4, 2018, now U.S. Pat. No. 10,796,991 issued on Oct. 6, 2020, which is a continuation of U.S. application Ser. No. 14/957,113, filed on Dec. 2, 2015, now U.S. Pat. No. 10,115,667 issued on Oct. 30, 2018, which claims priority under 35 U.S.C. § 119 to Korean Patent Application No. 10-2014-0172283, filed on Dec. 3, 2014, the Korean Intellectual Property Office, the disclosures of which are incorporated by reference herein in their entireties.

TECHNICAL FIELD

Exemplary embodiments of the inventive concept relate to a semiconductor device, a method of fabricating the semiconductor device, and an electronic system employing the semiconductor device and the method.

DESCRIPTION OF RELATED ART

In semiconductor devices such as a flash memory, a degree of integration may be an important factor in determining price. For example, two-dimensional semiconductor devices including two-dimensionally arranged memory cells may require very expensive equipment to obtain fine-sized patterns which increase the degree of integration. Accordingly, there is a limit to increasing the degree of integration of the two-dimensional semiconductor devices. Three-dimensional semiconductor devices including three-dimensionally arranged memory cells may have a higher degree of integration than the two-dimensional semiconductor devices. However, process failures and device defects may occur as pattern sizes of the three-dimensional semiconductor devices decrease.

SUMMARY in accordance with an exemplary embodiment of the inventive concept, a semiconductor device is provided. The semiconductor device includes a cell semiconductor pattern disposed on a semiconductor substrate. A semiconductor dummy pattern is disposed on the semiconductor substrate. The semiconductor dummy pattern is co-planar with the cell semiconductor pattern. A first circuit is disposed between the semiconductor substrate and the cell semiconductor pattern. A first interconnection structure is disposed between the semiconductor substrate and the cell semiconductor pattern. The first interconnection structure is electrically connected to the first circuit and extends away from the cell semiconductor pattern, A first dummy structure is disposed between the semiconductor substrate and the cell semiconductor pattern. A portion of the first dummy structure is co-planar with a portion of the first interconnection structure. A second dummy structure not overlapping the cell semiconductor pattern is disposed on the semiconductor substrate. A portion of the second dummy structure is co-planar with a portion of the first interconnection structure. A cell array region is disposed on the cell semiconductor pattern. A conductive shielding pattern is disposed between the cell semiconductor pattern and the semiconductor substrate. The conductive shielding pattern is disposed above the first circuit and the first interconnection structure.

The cell semiconductor pattern and the semiconductor dummy pattern include silicon.

The semiconductor dummy pattern has a smaller size than the cell semiconductor pattern.

The semiconductor dummy pattern is electrically isolated.

The first dummy structure includes a first dummy pattern and a second dummy pattern disposed on the first dummy pattern.

In accordance with an exemplary embodiment of the inventive concept, a semiconductor device is provided. The semiconductor device includes a cell semiconductor pattern disposed on a semiconductor substrate. A first circuit is disposed between the semiconductor substrate and the cell semiconductor pattern. A cell array region is disposed on the cell semiconductor pattern. A first interconnection structure is disposed between semiconductor substrate and the cell semiconductor pattern. The first interconnection structure is electrically connected to the first circuit. The first interconnection structure includes a plurality of first interconnections extending away from the cell semiconductor pattern. The first interconnections have an interconnection density that decreases moving away from the cell semiconductor pattern. A first dummy structure is disposed between the semiconductor substrate and the cell semiconductor pattern. The first dummy structure includes first dummy patterns co-planar with the first interconnections.

The first dummy structure is electrically isolated.

The first dummy pattern includes the same material and has substantially the same thickness as the first interconnections.

The semiconductor further includes second dummy patterns disposed on the semiconductor substrate, wherein the second dummy patterns are co-planar with the first interconnections.

The second dummy patterns do not overlap the cell semiconductor pattern.

The second dummy patterns have a lower pattern density at an area closer to the cell semiconductor pattern than at an area farther away from the cell semiconductor pattern.

The second dummy patterns face end portions of the first interconnections.

The second dummy patterns are spaced apart from the first interconnections.

In accordance with an exemplary embodiment of the inventive concept, a semiconductor device is provided. The semiconductor device includes a first cell semiconductor pattern and a second cell semiconductor pattern disposed on the semiconductor substrate and having substantially the sarin thickness. First and second circuits are disposed between the semiconductor substrate and the first cell semiconductor pattern. Third and fourth circuits are disposed between the semiconductor substrate and the second cell semiconductor pattern. A first cell array region is disposed on the first cell semiconductor pattern, and a second cell array region is disposed on the second cell semiconductor pattern, First and second interconnection structures are disposed between the semiconductor substrate and the first cell semiconductor pattern. The first interconnection structure is electrically connected to the first circuit. The second interconnection structure is electrically connected to the second circuit. Third and fourth interconnection structures are disposed between the semiconductor substrate and the second cell semiconductor pattern. The third interconnection structure is electrically connected to the third circuit. The fourth interconnection structure is electrically connected to the fourth circuit. A dummy structure is disposed between the first cell semiconductor pattern and the second cell semiconductor pattern.

The dummy structure includes a semiconductor dummy pattern disposed on the semiconductor substrate between the first and second cell semiconductor patterns and having substantially the same thickness as the first and second cell semiconductor patterns, the first and second cell semiconductor patterns have substantially the same size, and the semiconductor dummy pattern has a smaller size than the first and second semiconductor patterns.

The first interconnection structure is disposed between the first cell semiconductor pattern and the semiconductor substrate, extends away frosh the first cell semiconductor pattern toward the second cell semiconductor pattern, and has a lower interconnection density at an area farther away from the first cell semiconductor pattern than at an area closer to the first cell semiconductor pattern, and the third interconnection structure is disposed between the second cell semiconductor pattern and the semiconductor substrate, extends away from the second cell semiconductor pattern to yard the first cell semiconductor pattern, and has a lower interconnection density at an area farther away from the second cell semiconductor pattern than at an area closer to the second cell semiconductor pattern.

The first and third interconnection structures include the same material, have substantially the same thickness and are disposed in the same plane.

A second dummy structure includes second interconnection dummy patterns disposed between the first and third interconnection structures, and the second interconnection dummy patterns include substantially the same material and have the same thickness as interconnections of the first and third interconnection structures and are disposed in the same plane as the interconnections of the first and third interconnection structures.

The second interconnection dummy patterns are spaced apart from the first and third interconnection structures and have a lower pattern density at an area closer to the first and second cell semiconductor patterns than at an area farther away from the first and second cell semiconductor patterns.

The semiconductor device further includes: a first conductive shielding pattern disposed between the first cell semiconductor pattern and the semiconductor substrate, and above the first and second circuits and the first and second interconnection structures; and a second conductive shielding pattern disposed between the second cell semiconductor pattern and the semiconductor substrate, and above the third and fourth circuits and the third and fourth interconnection structures.

In accordance with an exemplary embodiment of the inventive concept, a semiconductor device is provided. The semiconductor device includes a cell semiconductor pattern disposed on the semiconductor substrate. A first circuit is disposed between the semiconductor substrate and the cell semiconductor pattern. A cell may region and a staircase region are disposed on the cell semiconductor pattern. Cell gate conductive patterns are disposed on the cell semiconductor pattern. The cell gate conductive patterns cross the cell array region and extend into the staircase region. Cell vertical structures passing through the cell gate conductive patterns are disposed on the cell semiconductor pattern. A conductive shielding pattern is disposed between the semiconductor substrate and the cell semiconductor pattern. The conductive shielding pattern is disposed above the first circuit.

The conductive shielding pattern has a greater size than the cell array region.

The conductive shielding pattern is a plate type.

The conductive shielding pattern overlaps the cell array region and the staircase region.

The semiconductor device further includes: a ground interconnection disposed on the semiconductor substrate; and a ground contact structure connecting the ground interconnection to the conductive shielding pattern.

In accordance with an exemplary embodiment of the inventive concept, a semiconductor device is provided. The semiconductor device includes: a cell semiconductor pattern disposed on a substrate; a transistor disposed between the substrate and the cell semiconductor pattern; a first interconnection disposed between the transistor and the cell semiconductor pattern; and a second interconnection disposed in the same plane as the first interconnection, the second interconnection not being overlapped by the cell semiconductor pattern, wherein the first interconnection includes a plurality of interconnections extending away from the cell semiconductor pattern, the number of interconnections decreasing as they get farther from the cell semiconductor pattern, and wherein the second interconnection includes a plurality of interconnections extending toward the cell semiconductor pattern, the number of interconnections decreasing as they get closer to the cell semiconductor pattern.

The interconnections of the first interconnection and the interconnections of the second interconnection alternately overlap each other.

The interconnections of the first interconnection and the interconnections of the second interconnection overlap each other in an area not overlapped by the cell semiconductor pattern.

The semiconductor device further includes a third interconnection disposed in the same plane as the first and second interconnections.

The third interconnection is disposed on a first side of the first interconnection and the second interconnection is disposed on a second side of the first interconnection.

BRIEF DESCRIPTION OF THE DRAWINGS

The foregoing and other features of the inventive concept will become more apparent by describing in detail exemplary embodiments thereof with reference to the accompanying drawings. In the drawings:

FIG. 5 is a cross-sectional view illustrating a semiconductor device in accordance with an exemplary embodiment of the inventive concept;

FIGS. 9A, 9B, 9C, 9D, 9E, 9F and 9G are cross-sectional views illustrating a method of forming a semiconductor device in accordance with an exemplary embodiment of the inventive concept;

DETAILED DESCRIPTION OF THE EMBODIMENTS

Figure 1A:
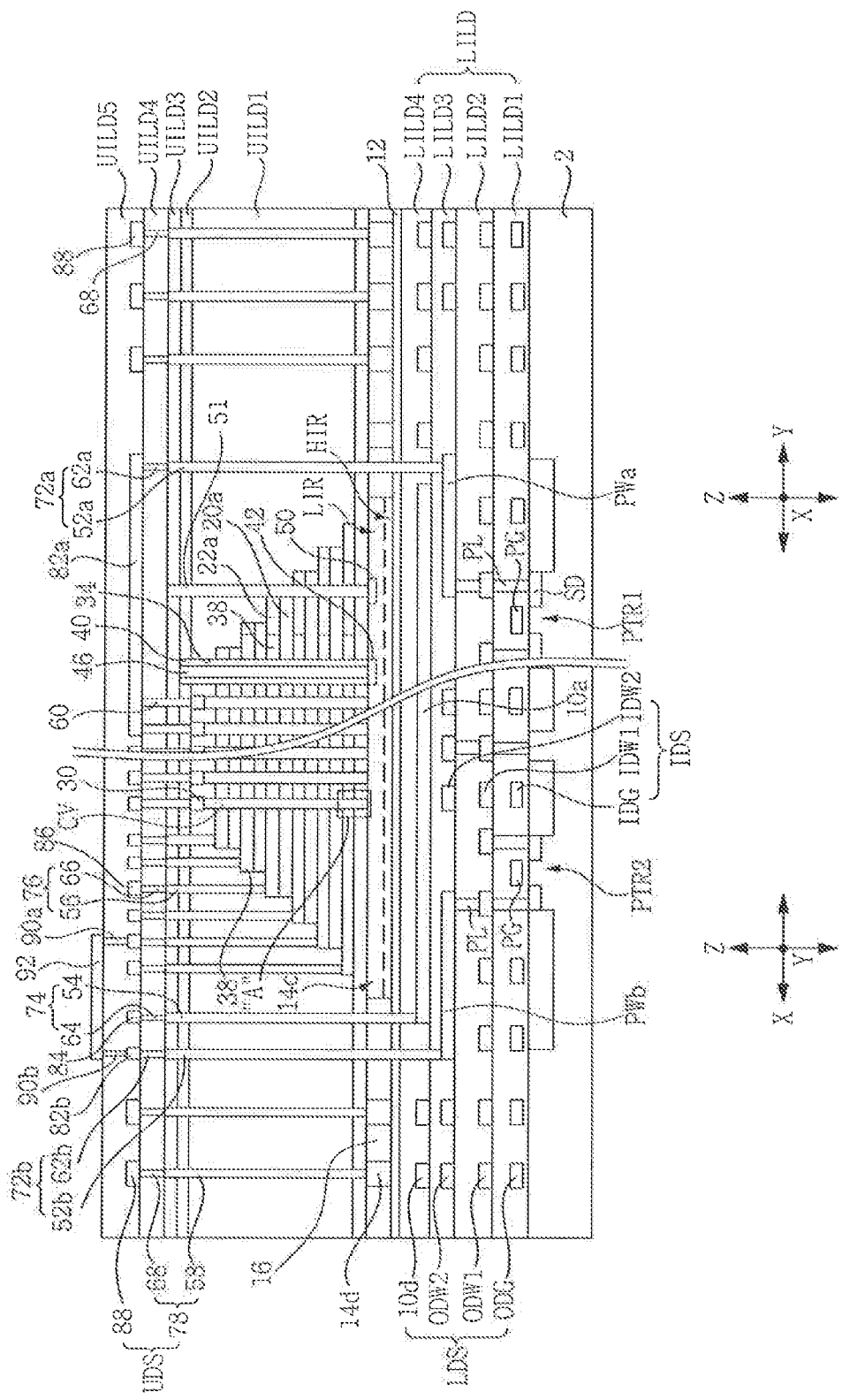
FIG. 1A is a cross-sectional view illustrating a semiconductor device in accordance with an exemplary embodiment of the inventive concept.

Hereinafter, exemplary embodiments of the inventive concept will be described detail with reference to the accompanying drawings. The inventive concept may, however, be embodied in various different forms and should be construed as limited by the embodiments set forth herein. In the drawings, the sizes and relative sizes of layers and regions may be exaggerated for clarity. The same reference symbols may denote the same components throughout the specification.

Exemplary embodiments of the inventive concept are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Therefore, regions illustrated in the drawings are schematic in nature, and their shapes are not intended to limit the scope of the inventive concept.

Further, it will be understood that when a layer is referred to as being on another layer or a substrate, the layer may be fir ted directly on the other layer or the substrate, or there may be an interest layer therebetween.

As used herein, the singular forms "a," "an," and "the" are intended to include the plural forms as well, unless the context clearly indicates otherwise.

Figure 1B:
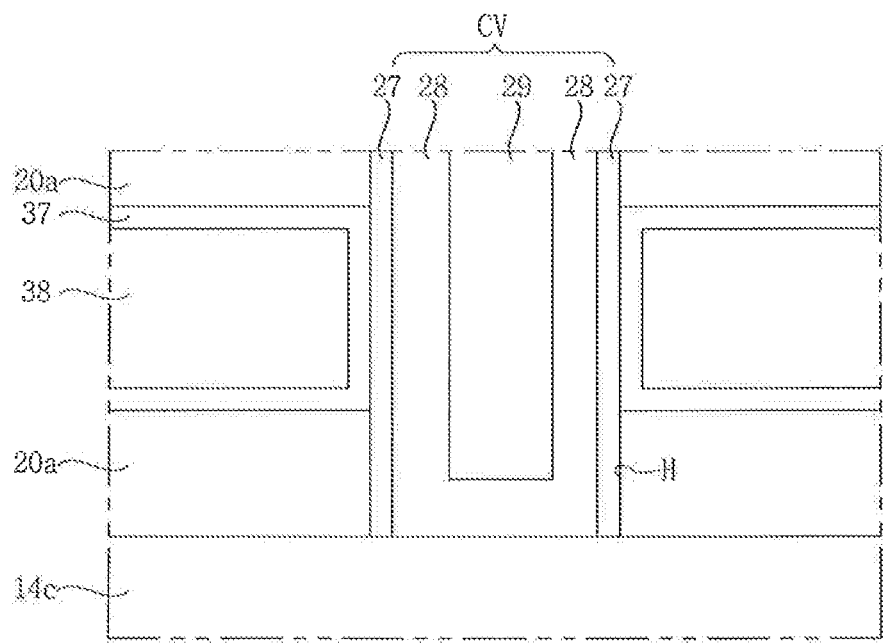
FIG. 1B is a partially enlarged view illustrating part "A" of FIG. 1A, according, to an exemplary embodiment of the inventive concept.
Figure 2A:
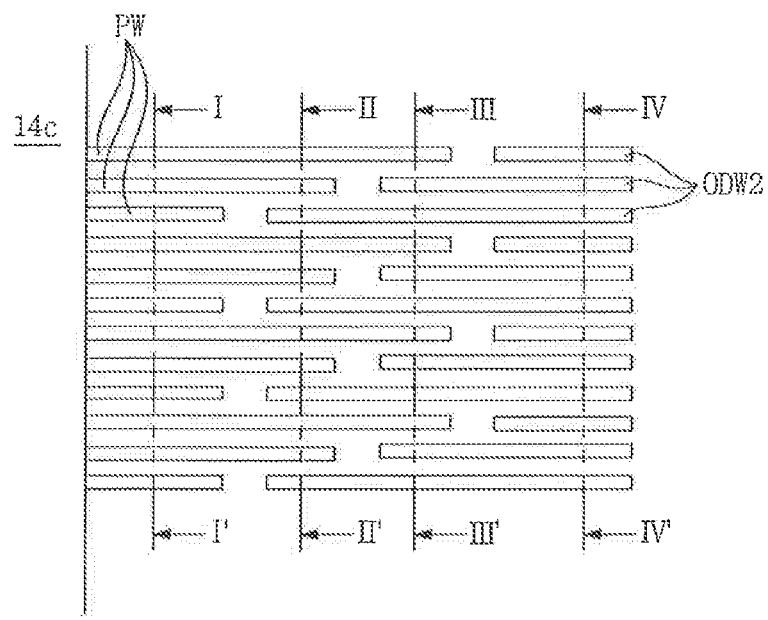
FIGS. 2A and 2B are plan views each illustrating components of FIG. 1A, according to an exemplary embodiment of the inventive concept.
Figure 2B:
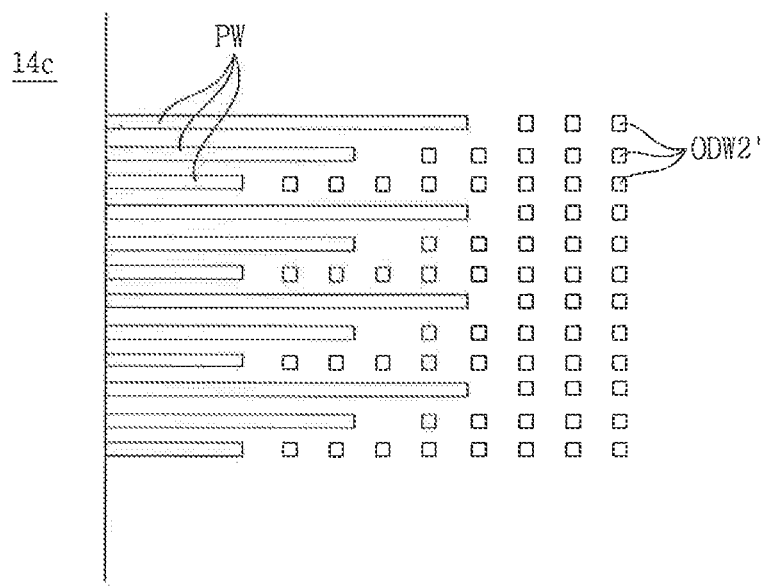
Figure 3A:
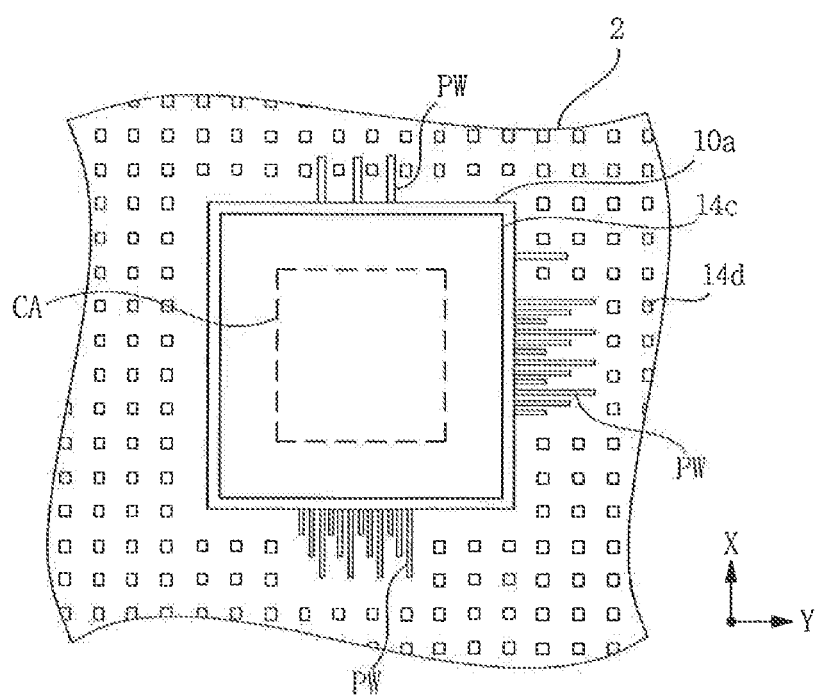
FIGS. 3A, 3B and 3C are plan views each illustrating components of FIG. 1A, according to an exemplary embodiment of the inventive concept.
Figure 3B:
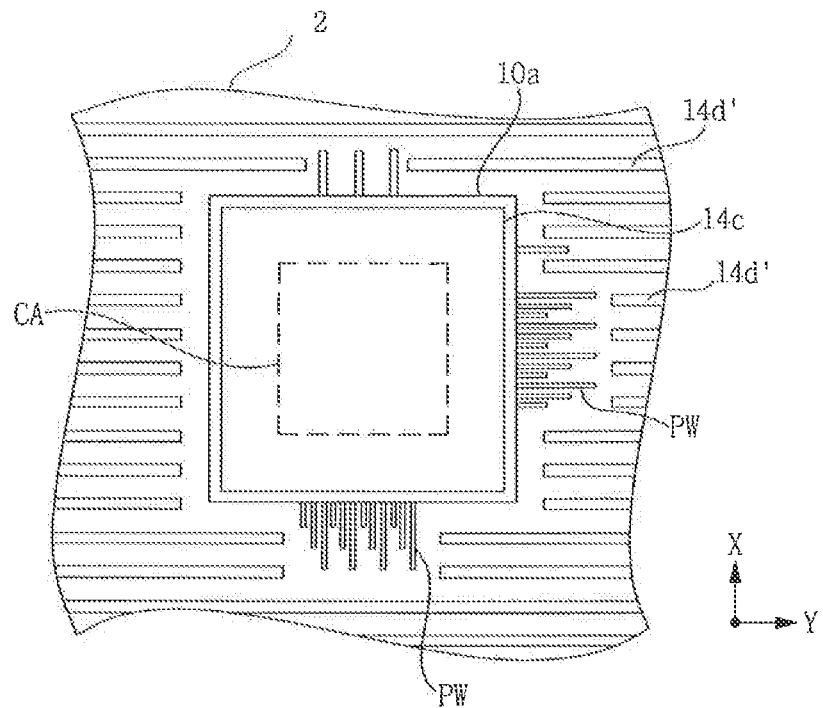
Figure 3C:
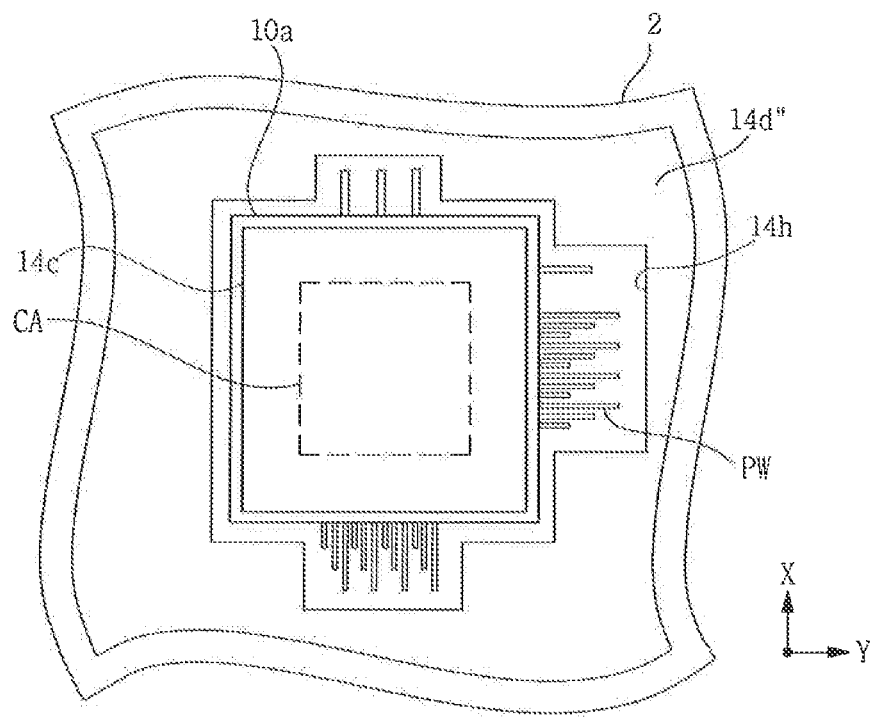
Figure 4:
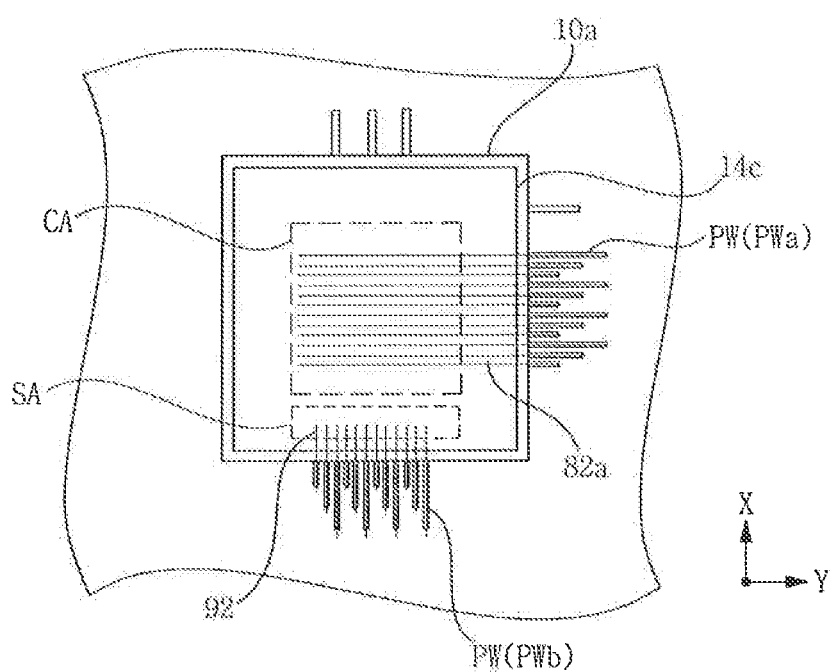
FIG. 4 is a plan view illustrating components of FIG. 1A, according to an exemplary embodiment of the inventive concept.

FIG. 1A is a cross-sectional view illustrating a semiconductor device in accordance with an exemplary embodiment of the inventive concept, FIG. 1B is a partially enlarged view illustrating part "A" of FIG. 1A, according to an exemplary embodiment of the inventive concept. FIGS. 2A and 2B are plan views each illustrating components of FIG. 1A, according to an exemplary embodiment of the inventive concept FIGS. 3A, 3B and 3C are plan views each illustrating components of FIG. 1A, according to an exemplary embodiment of the inventive concept. FIG. 4 is a plan view illustrating components of FIG. 1A, according to an exemplary embodiment of the inventive concept.

First, referring to FIGS. 1A and 1B, a semiconductor substrate 2 may be provided. The semiconductor substrate 2 may be a substrate formed of a semiconductor material such as silicon.

A first peripheral circuit PTR1 and a second peripheral circuit PTR2 may be disposed on the semiconductor substrate 2. Each of the first and second peripheral circuits PTR1 and PTR2 may include a peripheral transistor configured with a peripheral gate PG disposed on the semiconductor substrate 2 and peripheral impurity regions SD disposed in the semiconductor substrate 2 at both sides of the peripheral gates PG.

An inner dummy gate pattern IDG and an outer dummy gate pattern ODG formed of the same material and with the same thickness as the peripheral gates PG may be disposed on the semiconductor substrate 2.

A first lower interlayer insulating layer LILD1 covering the first and second peripheral circuits PTR1 and PTR2 and the dummy gate patterns IDG and ODG may be disposed on the semiconductor substrate 2.

Contact plugs PL passing through the first lower interlayer insulating layer LILD1 and electrically connected to the first and second peripheral circuits PTR1 and PTR2 may be disposed on the semiconductor substrate 2.

First and second peripheral lower interconnections, an inner peripheral lower dummy interconnection pattern IDW1, and an outer peripheral lower dummy interconnection pattern ODW1 formed of the same material and with the same thickness as the first lower interlayer insulating layer LILD1 may be disposed on the semiconductor substrate 2. The first and second peripheral lower interconnections, the inner peripheral lower dummy interconnection pattern IDW1, and the outer peripheral lower dummy interconnection pattern ODW1 may be disposed in the same plane.

A second lower interlayer insulating layer LILD2 covering the tint and second peripheral lower interconnections, the inner peripheral lower dummy interconnection pattern and the outer peripheral lower dummy interconnection pattern ODW1 may be disposed on the first lower interlayer insulating layer LILD1. Contact Otto PL passing through the second lower interlayer insulating layer LILD2 may be disposed on the first lower interlayer insulating layer LILD1.

A first peripheral upper interconnection structure PWa, a second peripheral upper interconnection structure PWb, an inner peripheral upper dummy interconnection pattern IDW2, and an outer peripheral upper dummy interconnection pattern ODW2 formed of the same material and with the same thickness may be disposed on the second lower interlayer insulating layer LILD2. The first peripheral upper interconnection structure PWa, the second peripheral upper interconnection structure PWb, the inner peripheral upper dummy interconnection pattern IDW2, and the outer peripheral tipper dun iv interconnection pattern ODW2 may be formed in the same plane. The first peripheral upper interconnection structure PWa may be electrically connected to the peripheral transistor of the first peripheral circuit PTR1 via the contact plugs PL. For example, the first peripheral upper interconnection structure PWa may be electrically connected to one of the peripheral impurity regions SD of the peripheral transistor of the first peripheral circuit PTR The second peripheral upper interconnection structure PWb may be electrically connected to the peripheral transistor of the second peripheral circuit PTR2 via the contact plugs PL. For example, the second peripheral upper interconnection structure PWb may be electrically connected to one of the peripheral impurity regions SD of the peripheral transistor of the second peripheral circuit PTR2.

A third lower interlayer insulating layer LILD3 covering the first and second peripheral upper interconnection structures PWa and PWb, the inner peripheral upper dummy interconnection pattern IDW2, and the outer peripheral upper dummy interconnection pattern ODW2 may be disposed on the second lower inlet-layer insulating layer LILD2.

A conductive shielding pattern 10a and an outer conductive dummy pattern 10d formed of the same material and with the same thickness may be formed on the third lower interlayer insulating layer LILD3. The conductive shielding pattern 10a and the outer conductive dummy pattern 10d may be formed of a metal material, such as tungsten, tungsten nitride, or titanium nitride.

In an exemplary embodiment of the inventive concept, the conductive shielding pattern 10a may cover the first and second peripheral circuits PTR1 and PTR2.

A fourth lower interlayer insulating layer LILD4 covering the conductive shielding pattern 10a and the outer conductive dummy pattern 10d may be formed on the third lower interlayer insulating layer LILD3.

The first to fourth lower interlayer insulating layers LILD1 to LILD4 may configure a lower interlayer insulating layer LILD.

The outer dummy gate pattern ODG, the outer peripheral lower dummy interconnection pattern ODW1, the outer peripheral upper dummy interconnection pattern ODW2, and the outer conductive dummy pattern 10d may be vertically stacked sequentially and configure a lower outer dummy structure LDS.

The inner dummy gate pattern IDG, the inner peripheral lower dummy interconnection pattern IDW1, and the inner peripheral upper dummy interconnection pattern IDW2 may be vertically stacked sequentially and configure an inner dummy structure IDS.

A buffer insulating layer 12 may be disposed on the fourth lower interlayer insulating layer LILD4. The buffer insulating layer 12 may have a different etching selectivity than the lower interlayer insulating layer LILD. For example, the buffer insulating layer 12 may be formed of silicon nitride, and the lower interlayer insulating layer LILD may be formed of silicon oxide.

A cell semiconductor pattern 14c and semiconductor dummy patterns 14d formed of the same material and with the same thickness and may be disposed on the buffer insulating layer 12. The cell semiconductor pattern 14c may be co-planar with the semiconductor dummy patterns 14d.

The cell semiconductor pattern 14c may be a cell semiconductor body pattern used as a body of a semiconductor device. The semiconductor dummy patterns 14d may be a semiconductor support pattern, or an electrically isolated semiconductor pattern, and referred to hereinafter interchangeably.

The cell semiconductor pattern 14c and the semiconductor dummy patterns 14d may be formed of silicon. The cell semiconductor pattern 14c and the semiconductor dummy patterns 14d may be formed of doped polysilicon.

The cell semiconductor pattern 14c may include a high concentration impurity region HIR, a low concentration impurity region LIR, a cell source impurity region 42, and a cell body, contact impurity region 50. The high concentration impurity region HIR, the low concentration impurity region LIR, and the cell body contact impurity region 50 may be a first conductivity type (e.g., a p-type conductivity), and the cell source impurity region 42 may be a second conductivity type (e.g, an n-type conductivity) different from the first conductivity type. The low concentration impurity region LIR may be disposed on the high concentration impurity region HIR, and have a lower impurity concentration than the high concentration impurity region HIR. The cell body contact impurity region 50 may have a higher impurity concentration than the low concentration impurity region LIR.

The first and second peripheral circuits PTR1 and PTR2 may be disposed between the semiconductor substrate 2 and the cell semiconductor pattern 14c.

The cell semiconductor pattern 14c may overlap the first and second peripheral circuits PTR1 and PTR2, and the inner dummy structure IDS. The cell semiconductor pattern 14c may not overlap the lower outer dummy structure LDS.

The first and second peripheral upper interconnection structures PWa and PWb may be disposed between the semiconductor substrate 2 and the cell semiconductor pattern 14c, and portions thereof may extend away from the cell semiconductor pattern 4c so as to be no longer underneath the cell semiconductor pattern 14c. The conductive shielding pattern 10a may be disposed between the semiconductor substrate 2 and the cell semiconductor pattern 14c.

In an exemplary embodiment of the inventive concept, the conductive shielding pattern 10a may have a greater width or size than the cell semiconductor pattern 18c.

An intermediate interlayer insulating layer 16 may be disposed on side surfaces of the cell semiconductor pattern 14c and the semiconductor dummy patterns 14d. The intermediate interlayer insulating layer 16 may be formed of silicon oxide.

Cell gate conductive patterns 38 arranged in a third direction Z perpendicular to the cell semiconductor pattern 14c may be disposed on the cell semiconductor pattern 14c. The cell gate conductive patterns 38 may include word lines of a memory device. End portions of the cell gate conductive patterns 38 may be disposed in a step structure that gradually descends in a first direction X.

Cell interlayer insulating layers 20a may be disposed between the lowermost pattern of the cell gate conductive patterns 38 and the cell semiconductor pattern 14c and between the cell gate conductive patterns 38. The cell interlayer insulating layers 20a may be formed of silicon oxide.

Molding patterns 22a may be disposed on the cell semiconductor pattern 14c in a second direction Y perpendicular to the first direction X. End portions of the molding patterns 22a may be disposed in a step structure that gradually descends in the first direction X. The molding patterns 22a may be co-planar with the cell gate conductive patterns 38. A first upper interlayer insulating layer UILD1 having a flat surface may be disposed on the cell gate conductive patterns 38, the molding pattern 22a, and the cell interlayer insulating layers 20a.

Cell vertical structures CV passing through the cell gate conductive patterns 38 and connected to the cell semiconductor pattern 14c may be disposed on the semiconductor substrate 2. Each of the cell vertical structures CV ma include a first cell dielectric layer (reference numeral 27 in FIG. 1B), a cell semiconductor layer (reference numeral 28 in FIG. 1B), a core insulating pattern (reference numeral 29 in FIG. 11B), and a cell pad pattern 30. The cell pad pattern 30 may be disposed on the core insulating pattern 29. The cell semiconductor layer 28 may be connected to the cell semiconductor pattern 14c. The cell semiconductor layer 28 may be disposed on side and bottom surfaces of the core insulating pattern 29. The first cell dielectric layer 27 may be disposed on an outer side of the cell semiconductor layer 28. The first cell dielectric layer 27 may be interposed between the cell semiconductor layer 28 and the cell gate conductive patterns 38. The cell semiconductor layer 28 and the cell pad pattern 30 may be formed of silicon. For example, the cell semiconductor layer 28 and the cell pad pattern 30 may be formed of polysilicon. The cell pad pattern 30 may have an n-type conductivity. A second cell dielectric layer 37 may be disposed between the cell gate conductive patterns 38 and the cell vertical structures CV.

One of the first and second cell dielectric layers 27 and 37 may include a data storage layer that stores data. For example, the first cell dielectric layer 27 may include a tunneling dielectric layer (e.g., silicon oxide) and a data storage layer (e.g., a silicon nitride layer that traps charges) sequentially formed from the cell semiconductor layer 28. The second cell dielectric layer 37 may include a shielding dielectric material. The first and second cell dielectric layers 27 and 37 may have the same structure as a dielectric layer including a data storage layer disposed between a control gate and a body of a cell transistor in a NAND flash memory device. However, the inventive concept may not be limited to the structure of the NAND flash memory device, and may be applied to a variety of memory devices.

A region in which the cell vertical structures CV are disposed on the cell semiconductor pattern 34*c* may be a cell array region CA.

A second upper interlayer insulating layer UILD2 may be disposed on the first upper interlayer insulating layer UILD1 and the cell vertical structures CV. A cell source pattern 46 passing through the first and second upper interlayer insulating layers UILD1 and UILD2 and the cell gate conductive patterns 38 may be disposed on the cell semiconductor pattern 14*c*. The cell source pattern 46 may be disposed on the cell source impurity region 42 of the cell semiconductor pattern 14*c*. The cell source pattern 46 may be electrically connected to the cell source impurity region 42 of the cell semiconductor pattern 14*c*. The cell source pattern 46 may be formed of a conductive material (e.g, Ti, TiN, or W). Insulating spacers 40 may be disposed on outer sides of the cell source pattern. The insulating spacers 40 may be disposed between the cell source pattern 46 and the cell gate conductive patterns 38.

A third upper interlayer insulating layer UILD3 may be disposed on the second upper interlayer insulating layer UILD2 and the cell source pattern 46. Cell gate lower contact plugs 56 passing through the first to third upper interlayer insulating layers UILD1 to UILD3 and electrically connected to the cell gate conductive patterns 38 may be disposed on the cell semiconductor pattern 14*c*.

A first peripheral lower contact plug 52*a* passing through the first to third upper interlayer insulating layers UILD1 to UILD3, the buffer insulating layer 12, and the third and fourth lower interlayer insulating layers LILD3 and LILD4 and electrically connected to the first peripheral upper interconnection structure PWa may be disposed on the semiconductor substrate 2. A second peripheral lower contact plug 52*b* passing through the first to third upper interlayer insulating layers UILD1 to UILD3, the buffer insulating layer 12, and the third and fourth lower interlayer insulating layers LILD3 and LILD4 and electrically connected to the second peripheral upper interconnection structure PWb may be disposed on the semiconductor substrate 2. A ground lower contact plug 54 passing through the first to third upper interlayer insulating layers UILD1 to UILD3 the buffer insulating layer 12, and the fourth lower interlayer insulating layer LILD4 and electrically connected to a contact portion of the conductive shielding pattern 10*a* may be disposed on the semiconductor substrate 2. A body contact plug 51 passing through the first to third upper interlayer insulating layers UILD1 to UILD3 and connected to the cell semiconductor pattern 14*c* may be disposed on the semiconductor substrate 2.

In an exemplary embodiment of the inventive concept, the body contact plug 51 may pass through the first to third upper interlayer insulating layers UILD1 to UILD3 and the last of cell interlayer insulating layers 20*a* and molding patterns 22*a* to be electrically connected to the cell body contact impurity region 50 of the cell semiconductor pattern 14*c*.

Peripheral lower contact dummy plugs 58 passing through the first to third upper interlayer insulating layers UILD1 to UILD3 may be disposed on the semiconductor substrate 2. The peripheral lower contact dummy plugs 58 may pass through the first to third upper interlayer insulating layers UILD1 to UILD3 and may be disposed on the semiconductor dummy patterns 14*d*. The peripheral lower contact dummy plugs 58 may pass through the first to third upper interlayer insulating layers UILD1 to UILD3 to be electrically connected to the semiconductor dummy patterns 14*d*.

A fourth upper interlayer insulating layer UILD4 may be disposed on the third upper interlayer insulating layer UILD3. Cell bit line contact plugs 60 passing through the second to fourth upper interlayer insulating layers UILD2 to UILD4 and electrically connected to the cell pad pattern 30 of the cell vertical structures CV may be disposed on the semiconductor substrate 2.

A first peripheral upper contact plug 62*a* passing through the fourth upper interlayer insulating layer UILD4 and electrically connected to the first peripheral lower contact plug 52*a* may be disposed on the semiconductor substrate 2. The first peripheral lower contact plug 52*a* and the first peripheral upper contact plug 62*a* may configure a first peripheral contact structure 72*a*. A second peripheral upper contact plug 62*b* passing through the fourth upper interlayer insulating layer UILD4 and electrically connected the second peripheral lower contact plug 52*b* may be disposed on the semiconductor substrate 2. The second peripheral lower contact plug 52*b* and the second peripheral upper contact plug 62*b* may configure a second peripheral contact structure 72*b*. A ground upper contact plug 64 passing through the fourth upper interlayer insulating layer UILD4 and electrically connected to the ground lower contact plug 54 may be disposed on the semiconductor substrate 2. The ground lower contact plug 54 and the ground upper contact plug 64 may configure a ground contact structure 74. Cell gate upper contact plugs 66 passing through the fourth upper interlayer insulating layer UILD4 and electrically connected to the cell gate lower contact plugs 56 may be disposed on the semiconductor substrate 2. The cell gate lower contact plugs 56 and the cell gate upper contact plugs 66 may configure cell gate contact structures 76.

Peripheral upper contact dummy plugs 68 passing through the fourth upper interlayer insulating layer UILD4 and disposed on the peripheral lower contact dummy plugs 58 may be disposed on the semiconductor substrate 2. The peripheral lower contact dummy plugs 58 and the peripheral upper contact dummy plugs 68 may configure a peripheral dummy contact structure 78.

A bit line 82*a*, a second peripheral interconnection 82*b*, a ground interconnection 84, cell gate interconnection 86, and a peripheral interconnection dummy structure 88 may be disposed on the fourth upper interlayer insulating layer UILD4.

The bit line 82*a* may be electrically connected to the cell bit line contact plugs 60 and the first peripheral contact structure 72a. Accordingly, the bit line 82a may electrically connect the cell pad pattern 30 of the cell vertical structure CV to the first peripheral circuit PTR1. The second peripheral interconnection 82b may be electrically connected to the second peripheral contact structure 72b. The ground interconnection 84 may be electrically connected to the ground contact structure 74. The cell gate interconnection 86 may be electrically connected to the cell gate contact structure 76. The peripheral interconnection dummy structure 88 may be connected to the peripheral dummy contact structure 78. The peripheral interconnection dummy structure 88 and the peripheral dummy contact structure 78 may configure an upper outer dummy structure UDS.

A fifth upper interlayer insulating layer UILD5 may be disposed on the fourth upper interlayer insulating layer UILD4. A first contact plug 90a passing through the fifth upper interlayer insulating layer UILD5 and electrically connected to the cell gate interconnection 86, and a second contact plug 90b passing through the fifth upper interlayer insulating layer UILD5 and electrically connected to the second peripheral interconnection 82b may be disposed on the semiconductor substrate 2.

A word line interconnection structure 92 electrically connected to the first and second contact plugs 90a and 90b may be disposed on the fifth upper interlayer insulating layer UILD5, The word line interconnection structure 92 may electrically connect the cell gate conductive pattern 38, in other words, a word line, to the second peripheral circuit PTR2.

FIGS. 2A and 2B are plan views each illustrating a positional relationship between the cell semiconductor pattern and peripheral interconnections, and the dummy interconnection patterns of FIG. 1, according to an exemplary embodiment of the inventive concept. A layout of one of the first peripheral upper interconnection structure Pwa electrically connected to the bit line 82a or the second peripheral upper interconnection structure PWb electrically connected to the cell gate conductive pattern 38 such as a word line, and a layout of the outer peripheral upper dummy interconnection pattern ODW2 will be described with reference to FIGS. 2A and 2B, respectively.

In FIG. 2A, the reference numeral "PW" may be understood as a "peripheral interconnection structure," in other words, one of the first and second peripheral upper interconnection structures PWa and PWb in FIG. 1A.

First, referring to FIG. 2A along with FIG. 1A, the peripheral interconnection structure PW may extend away, from the cell semiconductor pattern 14c and be configured with a plurality of peripheral interconnections. The peripheral interconnection structure PW may include peripheral interconnections extending away from the cell semiconductor pattern 14c in different lengths. In FIG. 2A, an interconnection density of the peripheral interconnections of the peripheral interconnection structure PW may be lower in the order of the portion marked by a line I-I', the portion marked by a line II-II', the portion marked b a line III-III', and the portion marked by a line IV-IV', The interconnection density of the peripheral interconnection structure PW may decrease as a distance from cell semiconductor pattern 14c increases.

The outer peripheral upper dummy interconnection pattern ODW2 may be disposed such that a pattern density thereof decreases approaching the cell semiconductor pattern 14c. For example, as illustrated in the portion marked by the line IV-IV' in FIG. 2A, the pattern density of the outer peripheral upper dummy interconnection pattern ODW2 may be higher in an area where the peripheral interconnections of the peripheral interconnection structure PW are not disposed, and may decrease approaching the portions marked by the lines III-III' and II-II' in FIG. 2A. Accordingly, the peripheral interconnection structure PW and the outer peripheral upper dummy interconnection pattern ODW2 may complementarily function to uniformize the pattern density on the semiconductor substrate 2.

As shown in the portions marked by the lines III-III' and II-II' in FIG. 2A, areas having a low pattern density in the outer peripheral upper dummy interconnection pattern ODW2 and areas having a low interconnection density of the peripheral interconnection structure PW may alternately overlap to increase the overall pattern density. Accordingly, in FIG. 2A, the portions marked try the lines I-I', II-II', III-III', and IV-IV' may have substantially similar or the same pattern density.

In an exemplary embodiment of the inventive concept, the outer peripheral upper dummy interconnection pattern ODW2 may be arranged in a line shape, but is not limited thereto. For example, the outer peripheral upper dummy interconnection pattern ODW2 may be arranged as a plurality of dot-shaped patterns ODW2' as illustrated in FIG. 2B. Here, the dot shape may be a rectangular shape, a square shape or a circular shape.

FIG. 3A is a plan view illustrating the cell semiconductor pattern 14c, the semiconductor dummy patterns 14d, the conductive shielding pattern 10a, and the peripheral interconnection structure PW of FIGS. 1A and 2A, according to an exemplary embodiment of the inventive concept.

Referring to FIG. 3A along with FIG. 1A, the cell semiconductor pattern 14c may be disposed on the semiconductor substrate 2. The conductive shielding pattern 10a may overlap the cell array region CA disposed on the cell semiconductor pattern 14c. The conductive shielding pattern 10a may have a greater planar area and/or width than the cell array region CA.

The conductive shielding; pattern 10a may prevent crosstalk between the cell array region CA disposed on the cell semiconductor pattern 14c, and the first and second peripheral circuits PTR1 and PTR2. The conductive shielding pattern 10a may prevent crosstalk between the cell array region CA disposed on the cell semiconductor pattern 14c, and the first and second peripheral upper interconnection structures PWa and PWb.

At least a portion of the conductive shielding pattern 10a may extend away from the cell semiconductor pattern 14c. The conductive shielding pattern 10a may overlap the cell semiconductor pattern 14c and have a greater planar area and/or width than the cell semiconductor pattern 14c.

The peripheral interconnection structure PW may include the second peripheral upper interconnection structure PWb and the first peripheral upper interconnection structure PWa, as illustrated in FIG. 1A. The peripheral interconnection structure PW may extend away from the cell semiconductor pattern 14c and away from the conductive shielding pattern 10a.

A plurality of semiconductor dummy patterns 14d may be disposed on the semiconductor substrate 2, and each of the semiconductor dummy patterns 14d may have a dot shape. Here, the dot shape may be a rectangular shape, a square shape or a circular shape, but is not limited thereto. The shape of the semiconductor dummy patterns 14d will be described with reference to FIGS. 3B and 3C.

Referring to FIG. 3B, the semiconductor dummy patterns 14d' may be a plurality of line patterns.

Referring to FIG. 3C, the semiconductor dummy patterns 14d" may be plate-type patterns including openings 14h exposing the cell semiconductor pattern 14c and the peripheral interconnection structure PW.

FIG. 4 is a plan view illustrating shapes of the bit line 82a and the word line interconnection structure 92 of FIG. 1A, according to an exemplary embodiment of the inventive concept.

Referring to FIG. 4 along with FIG. 1A, the bit line 82a may cress the cell array region CA in the second direction Y and extend away from the cell semiconductor pattern 14c. The bit line 82a may overlap the first peripheral upper interconnection structure PWa disposed at an outer side (or, edge) of the cell semiconductor pattern 14c.

The cell array region CA may be disposed on the cell semiconductor pattern 14c and a staircase area SA may be disposed on the cell semiconductor pattern 14c adjacent to the cell array region CA. The cell gate conductive patterns 38 may cross the cell array region CA in the first direction X and extend into the staircase area SA. The cell gate conductive patterns 38 may be disposed in a step structure in the staircase area SA.

The word line interconnection structure 92 may extend away from the cell semiconductor pattern 14c in the staircase area SA, and overlap the second peripheral upper interconnection structure PWb disposed at an outer side (or, edge) of the cell semiconductor pattern 14c.

In FIGS. 1A to 4, a structure including a single cell semiconductor pattern 14c is described. However, the inventive concept is not limited thereto. A structure in which a plurality of the cell semiconductor patterns 14c described in reference to FIGS. 1A to 4 are disposed will be described with reference to FIG. 5.

Referring to FIG. 5 along with FIG. 1A, the first and second peripheral circuits PTR1 and PTR2, the conductive shielding pattern 10a, and the cell semiconductor pattern 14c, described with reference to FIG. 1A, may be disposed on the semiconductor substrate 2, and the cell array region CA may be disposed on the cell semiconductor pattern 14c. The cell semiconductor pattern 14c may be referred to as a first cell semiconductor pattern, and the cell array region CA may be referred to as a first cell array region.

A second cell semiconductor pattern 14c' formed of the same material and having the same structure as the first cell semiconductor pattern 14c may be disposed on the semiconductor substrate 2.

Third and fourth peripheral circuits PTR1' and PTR2' corresponding to the first and second peripheral circuits PTR1 and PTR2 described with reference to FIG. 1A may be disposed between the semiconductor substrate 2 and the second cell semiconductor pattern 14c'. In addition, a third peripheral upper interconnection structure PWa' electrically connected to the third peripheral circuit PTR1' and a fourth peripheral upper interconnection structure PWb' electrically connected to the fourth peripheral circuit PTR2' may be disposed between the semiconductor substrate 2 and the second cell semiconductor pattern 14c'.

A conductive shielding pattern 10a' disposed between the semiconductor substrate 2 and the second cell semiconductor pattern 14c' may be disposed on the third and fourth peripheral circuits PTR1' and PTR2' and the third and fourth peripheral upper interconnection structures PWa' and PWb'. The conductive shielding pattern 10a' may be formed of the same material and have the same structure as the conductive shielding pattern 10a disposed between the semiconductor substrate 2 and the first cell semiconductor pattern 14c.

A cell array region CA' corresponding to the cell array region CA may be disposed on the second cell semiconductor pattern 14c'.

A dummy structure as illustrated in FIG. 1A may be disposed between the first cell semiconductor pattern 14c and the second cell semiconductor pattern 14c'. The dummy structure may be the lower outer dummy structure LDS, the semiconductor dummy patterns 14d, and the upper outer dummy structure UDS.

The first and third peripheral upper interconnection structures PWa and PWa' and the outer peripheral upper dummy interconnection pattern ODW2 disposed between the first cell semiconductor pattern 14c and the second cell semiconductor pattern 14c' in FIG. 1 will be described with reference to FIG. 6A.

Figure 6A:
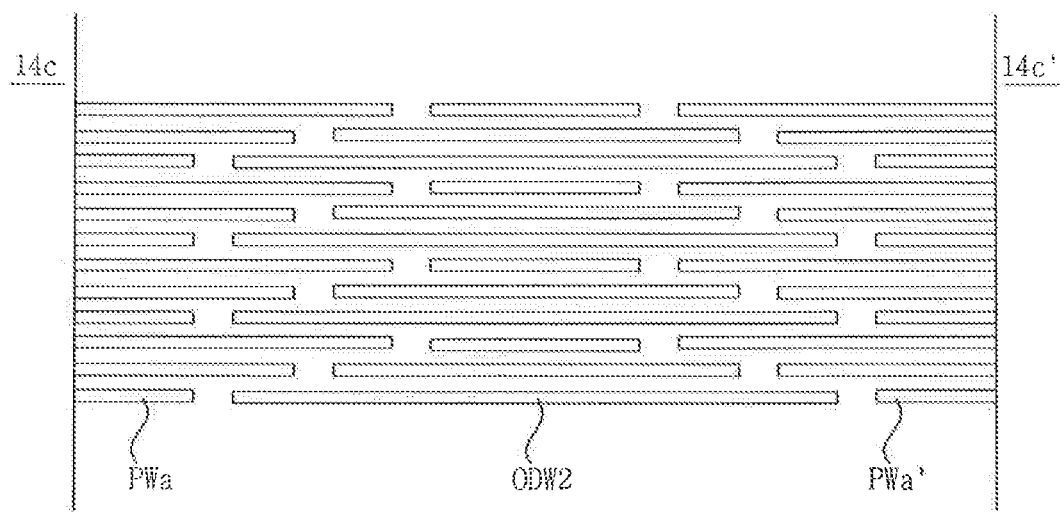
FIGS. 6A, 6B, and 7 are plan views each illustrating components of FIG. 5, according to an exemplary embodiment of the inventive concept.

Referring to FIG. 6A along with FIG. 5, each of the first and third peripheral upper interconnection structures PWa and PWa' may be configured with a plurality of peripheral interconnections.

The first upper peripheral interconnection structure PWa may extend away from the first cell semiconductor pattern 14c. The first upper peripheral interconnection structure PWa may extend from an outer side of the first cell semiconductor pattern 14c toward the second cell semiconductor pattern 14c'. An interconnection density of the first upper peripheral interconnection structure PWa may decrease as a distance from the first cell semiconductor pattern 14c increases, as described with reference to FIG. 2A.

The third peripheral upper interconnection structure PWa' may extend away from the second cell semiconductor pattern 14c'. The third peripheral upper interconnection structure. PWa' may extend from an outer side of the second cell semiconductor pattern 14c' toward the first cell semiconductor pattern 14c. An interconnection density of the third peripheral tipper interconnection structure PWa' may decrease as a distance from the second cell semiconductor pattern 14c' increases, as described with reference to FIG. 2A.

The outer peripheral upper dummy interconnection pattern ODW2 may be disposed such that a pattern density thereof decreases approaching the first and second cell semiconductor patterns 14c and 14c' in the same manner as described with reference to FIG. 2A. Accordingly, the first the third peripheral upper interconnection structures PWa and PWa' and the outer peripheral upper dummy interconnection pattern ODW2 may complementarily serve to uniformize the pattern density on the semiconductor substrate 2.

Figure 6B:
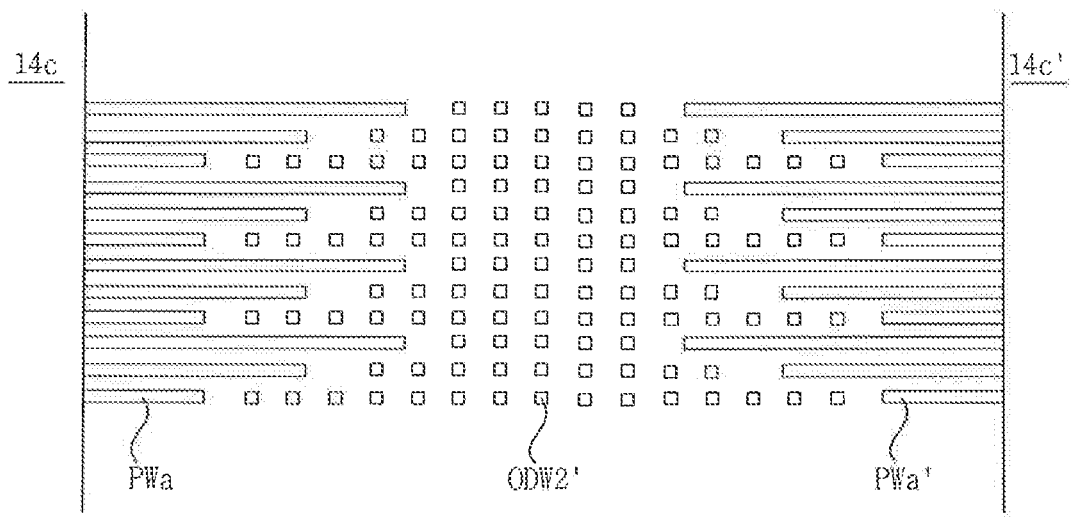

In an exemplary embodiment of the inventive concept, the outer peripheral upper dummy interconnection pattern ODW2 may be disposed in line shapes, but is not limited thereto. For example, the outer peripheral upper dummy interconnection pattern ODW2 may be disposed in a plurality of dot-shaped patterns ODW2' as illustrated in FIG. 6B. Here, the dot shape may be a rectangular shape, a square shape or a circular shape.

Figure 7:
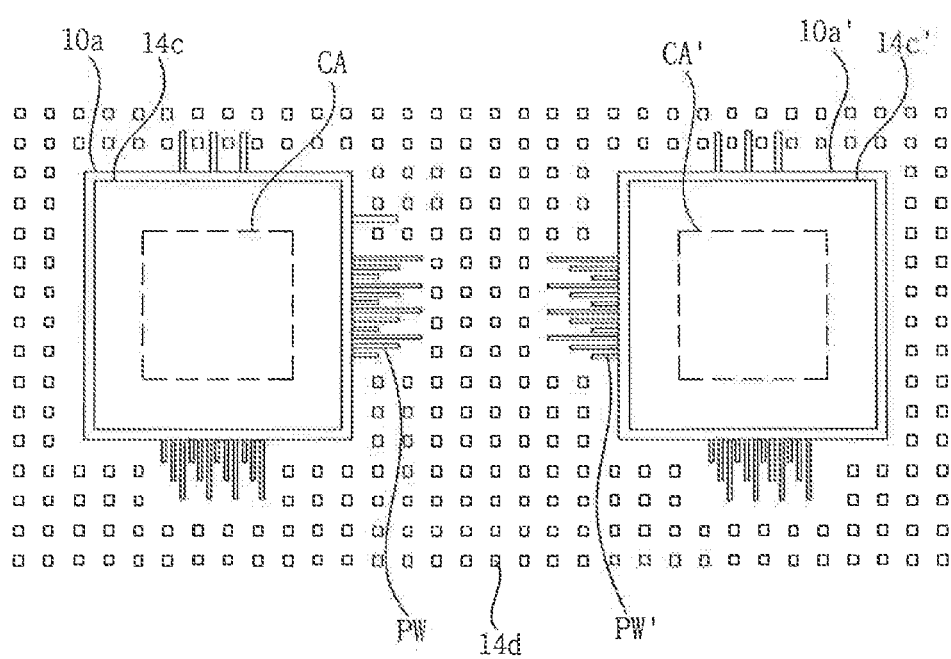

FIG. 7 is a plan view for describing the first and second cell semiconductor patterns 14c and 14c', the semiconductor dummy patterns 14d, the conductive shielding patterns 10a and 10a', and the peripheral interconnection structures PW and PW'.

Referring to FIG. 3A along with FIG. 1A, the first and second cell semiconductor patterns 14c and 14c' may be disposed on the semiconductor substrate 2. The conductive shielding patterns 10a and 10a' may have a greater planar area than the cell array regions CA and CA'. The conductive shielding patterns 10a and 10a' may have a greater planar area than the first and second cell semiconductor patterns 14c and 14c'.

The semiconductor dummy patterns 14d may be disposed around the first and second cell semiconductor patterns 14c and 14c'. In addition, the semiconductor dummy patterns 14d may be disposed between the first and second cell semiconductor patterns 14c and 14c'.

Figure 8:
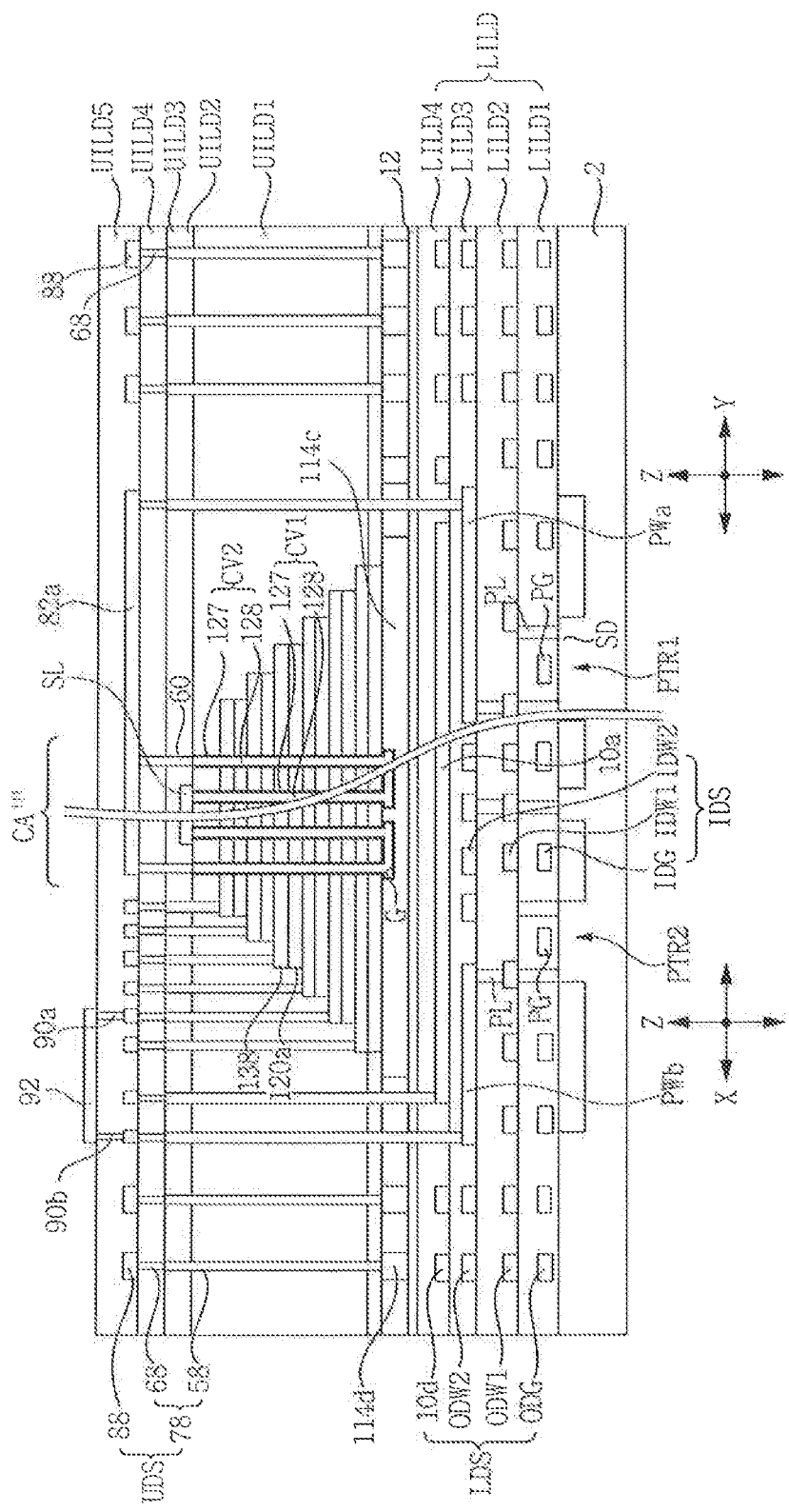
FIG. 8 is a cross-sectional view illustrating a semiconductor device in accordance with an exemplary embodiment of the inventive concept.

FIG. 8 is a cross-sectional view illustrating a semiconductor device in accordance with an exemplary embodiment of the inventive concept.

Referring to FIG. 8, the first and second peripheral circuits PTR1 and PTR2, the first and second peripheral upper interconnection structures PWa and PWb, the inner dummy structure IDS, the lower outer dummy structure LDS, the upper outer dummy structure UDS, the conductive shielding pattern 10a, the lower interlayer insulating layer LILD, and the buffer insulating layer 12 may be disposed on the semiconductor substrate 2, as described with reference to FIG. 1A.

A cell semiconductor pattern 114c and a dummy semiconductor pattern 114d may be disposed on the lower interlayer insulating layer LILD. The cell semiconductor pattern 114c and the dummy semiconductor pattern 114d may be formed with the same material and the same thickness. The cell semiconductor pattern 114c and the dummy semiconductor pattern 114d may be formed of doped silicon. The cell semiconductor pattern 114c and the dummy semiconductor pattern 114d may be formed of doped polysilicon. The cell semiconductor pattern 114c may be co-planar with the dummy semiconductor pattern 114d.

Cell gate conductive patterns 138 vertically stacked on the cell semiconductor pattern 114c and spaced apart from each other may be disposed on the semiconductor substrate 2. Cell interlayer insulating patterns 120a may be disposed between the cell gate conductive patterns 138.

A plurality of cell vertical structures CV1 and CV2 passing through the cell gate conductive patterns 138 and the cell interlayer insulating patterns 120a may be disposed on the semiconductor substrate 2. A source line SL connecting first cell vertical structures CV1 may be disposed on a pair of adjacent first cell vertical structures CV1 among the cell vertical structures CV1 and CV2. Second cell vertical structures CV2 may be disposed at both sides of the first cell vertical structures CV1. A bit line 82a may be disposed on the second cell vertical structures CV2. Bit line contact plugs 60 may be disposed between the bit line 82a and the second cell vertical structures CV2. The bit line contact plugs 60 may connect the bit line 82a to the second cell vertical structures CV2. The first and second cell vertical structures CV1 and CV2 may be connected to each other with a pipe structure through a groove G formed in the cell semiconductor pattern 114c. The first and second cell vertical structures CV1 and CV2 may be connected to each other by extending through the groove G in the cell semiconductor pattern 114c.

Each of the first and second cell vertical structures CV1 and CV2 may include a cell dielectric layer 127 interposed between a channel semiconductor layer 128 and the cell gate conductive patterns 138, and between the channel semiconductor layer 128 and the cell semiconductor pattern 114c. The cell dielectric layer 127 may include a first dielectric layer, a data storage layer capable of trapping charges, and a second dielectric layer. The cell semiconductor pattern 114c may be a back-gate.

Next, a method of forming a semiconductor device in accordance with an exemplary embodiment of the inventive concept will be described with reference to FIGS. 9A, 9B, 9C, 91D, 9E, 9F and 9G.

Figure 9A:
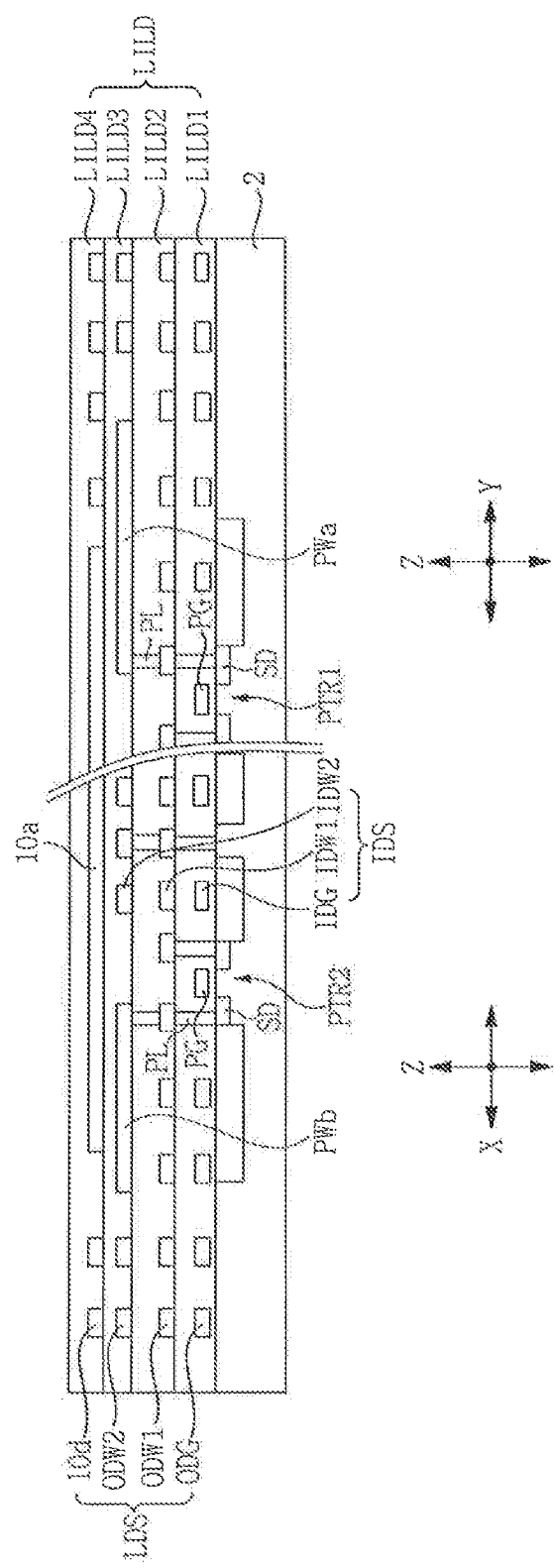

Referring to FIG. 9A, a semiconductor substrate 2 may be prepared. The semiconductor substrate 2 may be formed of a semiconductor material such as silicon. A first peripheral circuit PTR1 and a second peripheral circuit PTR2 may be formed on the semiconductor substrate 2. Each of the First and second peripheral circuits PTR1 and PTR2 may include peripheral transistors configured with peripheral gates PG disposed on the semiconductor substrate 2 and first and second peripheral impurity regions SD formed in the semiconductor substrate 2 at both sides of the peripheral gates PG.

Dummy gate patterns may be formed on the semiconductor substrate 2 simultaneously with the peripheral gates PG of the first and second peripheral circuits PTR1 and PTR2. The dummy gate pattern may include an inner dummy gate pattern IGD and an outer dummy gate pattern OGD. A first lower interlayer insulating layer LILD1 covering the first and second peripheral circuits PTR1 and PTR2 and the dummy gate patterns IDG and ODG may be formed on the semiconductor substrate 2.

The formation of the first lower interlayer insulating layer LILD1 may include depositing an insulating material layer on the substrate 2 including the first and second peripheral circuits PTR1 and PTR2 and the inner and outer dummy gate patterns IDG and ODG, and planarizing the insulating material layer. Since the inner and outer dummy gate patterns IDC and ODG further uniformize a pattern density on the semiconductor substrate 2, a level difference of an upper surface of the insulating material layer used to form the patterns having the uniform density may be minimized. The upper surface of the insulating material layer having such a minimized level difference may be planarized without the dishing phenomenon occurring. Accordingly, the first lower interlayer insulating layer LILD1 may be formed to have a more planar upper surface.

Contact plugs PL passing through the first lower interlayer insulating layer LILD1 and electrically connected to the first and second peripheral circuits PTR1 and PTR2 may be formed on the semiconductor substrate 2.

First and second peripheral lower interconnections, and peripheral lower dummy interconnection patterns may be formed on the first lower interlayer insulating layer LILD1. The peripheral lower dummy interconnection patterns may include an inner peripheral lower dummy interconnection pattern IDW1 and an outer peripheral lower dummy interconnection pattern ODW1.

A second lower interlayer insulating layer LILD2 covering the first and second peripheral lower interconnections and the inner and outer peripheral lower dummy interconnection patterns IDW1 and ODW1 may be formed on the first lower interlayer insulating layer LILD1. Since the inner and outer peripheral lower dummy interconnection patterns IDW1 and ODW1 uniformize the overall pattern density, the second lower interlayer insulating layer LILD2 may have a more planar upper surface, similar to the first lower interlayer insulating layer LILD1.

Contact plugs PL passing through the second lower interlayer insulating layer LILD2 may be formed on the semiconductor substrate 2. A first peripheral upper interconnection structure PWa and second peripheral upper interconnection structure PWb may be formed on the second lower interlayer insulating layer LILD2. The first peripheral upper interconnection structure PWa may be electrically connected to transistors of the first peripheral circuit PTR1 via the contact plugs PL formed in the first and second lower interlayer insulating layers LILD1 and LILD2. The second peripheral upper interconnection structure PWb may be electrically connected to peripheral transistors of the second peripheral circuit PTR2 via the contact plugs PL formed in the first and second lower interlayer insulating layers LILD1 and LILD2.

Peripheral dummy upper interconnection patterns may be formed on the second lower interlayer insulating layer LILD2 simultaneously with the first and second peripheral upper interconnection structures PWa and PWb. The peripheral upper dummy interconnection patterns may include an inner peripheral upper dummy interconnection pattern IDW2 and an outer peripheral upper dummy interconnection pattern ODW2.

A third lower interlayer insulating layer LILD3 covering the first and second peripheral upper interconnection structures PWa and PWb and the inner and outer peripheral upper dummy interconnection patterns IDW2 and ODW2 may be formed on the second lower interlayer insulating layer LILD2. Since the inner and outer peripheral upper dune interconnection patterns IDW2 and ODW2 uniformize the overall pattern density, the third lower interlayer insulating layer LILD3 may have a more planar upper surface, similar to the first lower interlayer insulating layer LILD1.

A conductive shielding pattern 10a and an outer conductive dummy pattern 10d may be formed on the third lower interlayer insulating layer LILD3. The conductive shielding pattern 10a and the outer conductive dummy pattern 10d may be formed of a metal material, such as tungsten, tungsten nitride, and titanium nitride.

In an exemplary embodiment of the inventive concept, the conductive shielding pattern 10a may cover the first and second peripheral circuits PTR1 and PTR2.

A fourth lower interlayer insulating layer LILD4 covering the conductive shielding pattern 10a and the outer conductive dummy pattern 10d may be formed on the third lower interlayer insulating layer. Due to the outer conductive dummy pattern 10d, the fourth lower interlayer insulating layer LILD4 may be formed to be more planar.

The first to fourth lower interlayer insulating layers LILD1 to LILD4 may configure a lower interlayer insulating layer LILD.

The outer dummy gate pattern ODG, the outer peripheral lower dummy interconnection pattern ODW1, the outer peripheral upper dummy interconnection pattern ODW2, and the outer conductive dummy gate pattern 10d may configure a lower outer dummy structure LDS. The inner dummy gate pattern IDG, the inner peripheral lower dummy interconnection pattern IDW1, and the inner peripheral upper dummy interconnection pattern IDW2 may configure an inner dummy structure IDS.

Accordingly, since the lower outer dummy structure LDS and the inner dummy structure IDS uniformize a density of patterns disposed on the same level, the lower interlayer insulating layer LILD may have a more planar upper surface.

Referring to FIG. 9B, a buffer insulating layer 12 may be formed on the lower interlayer insulating layer LILD. The buffer insulating layer 12 may have a different etching selectivity from the lower interlayer insulating layer LILD. For example, the buffer insulating layer 12 may be formed of silicon nitride, and the lower interlayer insulating layer LILD may be formed of silicon oxide.

A cell semiconductor pattern 14c and semiconductor dummy patterns 14d may be formed by forming a semiconductor layer on the buffer insulating layer 12 and patterning the semiconductor layer. The cell semiconductor pattern 14c may be a cell semiconductor pattern, and the semiconductor dummy pattern 14d may be a semiconductor support pattern or a semiconductor dummy pattern.

The cell semiconductor pattern 14c and the semiconductor dummy patterns 14d may have the same thickness. Upper surfaces of the cell semiconductor pattern 14c and the semiconductor dummy patterns 14d may be coplanar.

The cell semiconductor pattern 14c and the semiconductor dummy patterns 14d may be formed of silicon. The cell semiconductor pattern, 14c and the semiconductor dummy patterns 14d may be formed of doped polysilicon. For example, the cell semiconductor pattern 14c and the semiconductor dummy patterns 14d may be formed of Hype doped silicon. The cell semiconductor pattern 14c may include a high concentration impurity region HIR and a low concentration impurity region LIR disposed on the high concentration impurity region HIR and having a lower impurity concentration than the high concentration impurity region HIR.

The cell semiconductor pattern 14c may overlap the first and second peripheral circuits PTR1 and PTR2. The cell semiconductor pattern 14c may overlap the first and second peripheral upper interconnection structures PWa and PWb electrically connected to the first and second peripheral circuits PTR1 and PTR2. The first and second peripheral upper interconnection structures PWa and PWb may extend. Fay from the cell semiconductor pattern 14c to be electrically connected to an external device. The cell semiconductor pattern 14c may overlap the conductive shielding pattern 10a. The cell semiconductor pattern 14c may be formed to have a smaller width or smaller size than the conductive shielding pattern 10a.

Figure 9C:
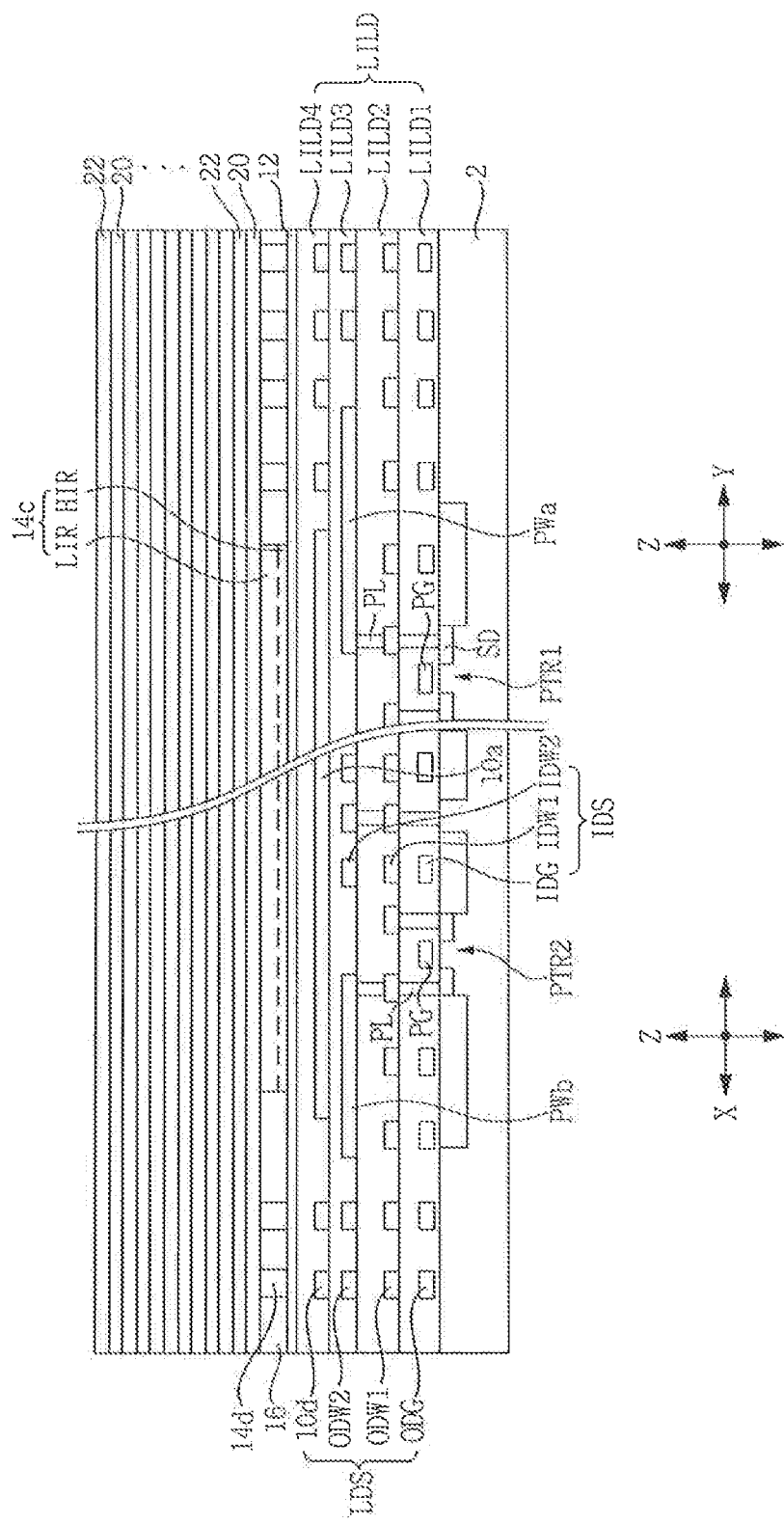

Referring to FIG. 9C, an intermediate interlayer insulating layer 16 may be formed by forming an insulating layer on the semiconductor substrate 2 including the cell semiconductor pattern 14c and the semiconductor dummy patterns 14d and planarizing the insulating layer until the cell semiconductor pattern 14c and the semiconductor dummy patterns 14d are exposed. The intermediate interlayer insulating layer 16 may be formed of silicon oxide.

While planarizing the insulating layer to form the intermediate interlayer insulating layer 16, the cell semiconductor pattern 14c may prevent a dishing phenomenon from occurring on the intermediate interlayer insulating layer 16. For example, while planarizing the insulating layer, the cell semiconductor pattern 14c may serve as a support, which can help prevent the dishing phenomenon from occurring.

First molding layers 20 and second molding layers 22 may be alternately and repeatedly formed on the semiconductor substrate 2 including the cell semiconductor pattern 14c, the semiconductor dummy pane s 14d, and the intermediate interlayer insulating layer 16. Accordingly, a plurality of first molding layers 20 and a plurality of second molding layers 22 may be formed on the semiconductor substrate 2. The first molding layer 20 may have a different etching selectivity than the second molding layer 22. For example, the first molding layer 20 may be formed of silicon oxide, and the second molding layer 22 may be formed of silicon nitride.

Due to the lower outer dummy structure LDS and the semiconductor dummy patterns 14d, the first molding layers 20 and the second molding layers 22 may be uniformly formed on a planar surface. Accordingly, a condition in which portions of the first molding layers 20 and the second molding layers 22 sag down toward the semiconductor substrate 2, may be prevented. Thus, the uniformly formed first molding layers 20 and second molding layers 22 may facilitate a subsequent process thereof. In other words, since a first pair of the first molding layer 20 and the second molding layer 22 directly contacting each other are uniformly formed, a second pair of the first molding lager 20 and the second molding layer 22 formed directly on the first pair, may be uniformly formed. Accordingly, the number of process failures and device defects may be reduced, and thus productivity may be increased.

Figure 9D:
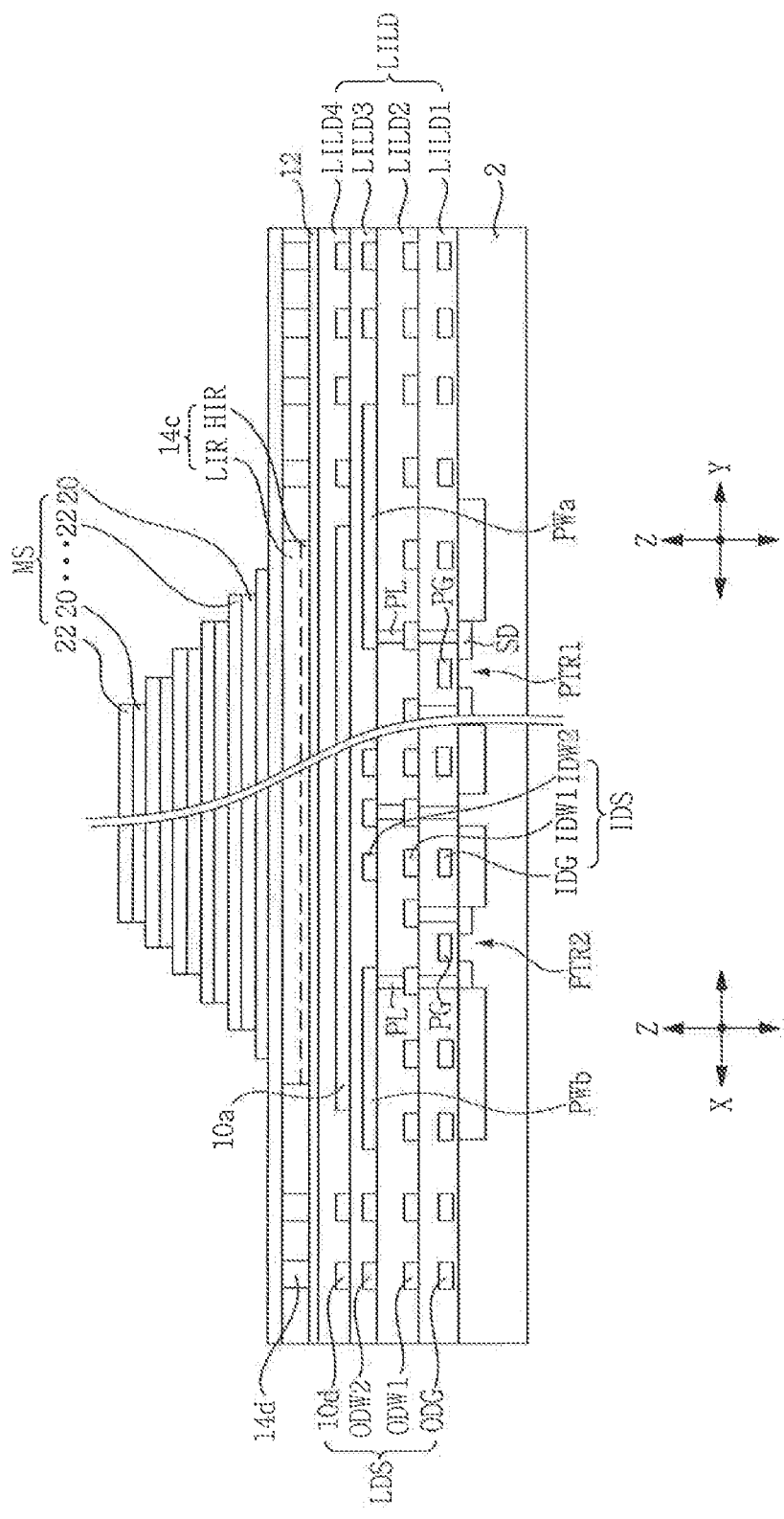

Referring to FIG. 9D, a molding structure MS may be formed by patterning the first and second molding layers 20 and 22. End portions of the patterned first and second molding layers 20 and 22 of the molding structure MS may have a step structure. The molding structure MS may be formed on the cell semiconductor pattern 14c.

In art exemplary embodiment of the inventive concept, the lowermost first molding layer of the first molding layers 20 may not be patterned. The lowermost first molding layer may be the first molding layer 20 directly above the cell semiconductor pattern 14c.

Figure 9E:
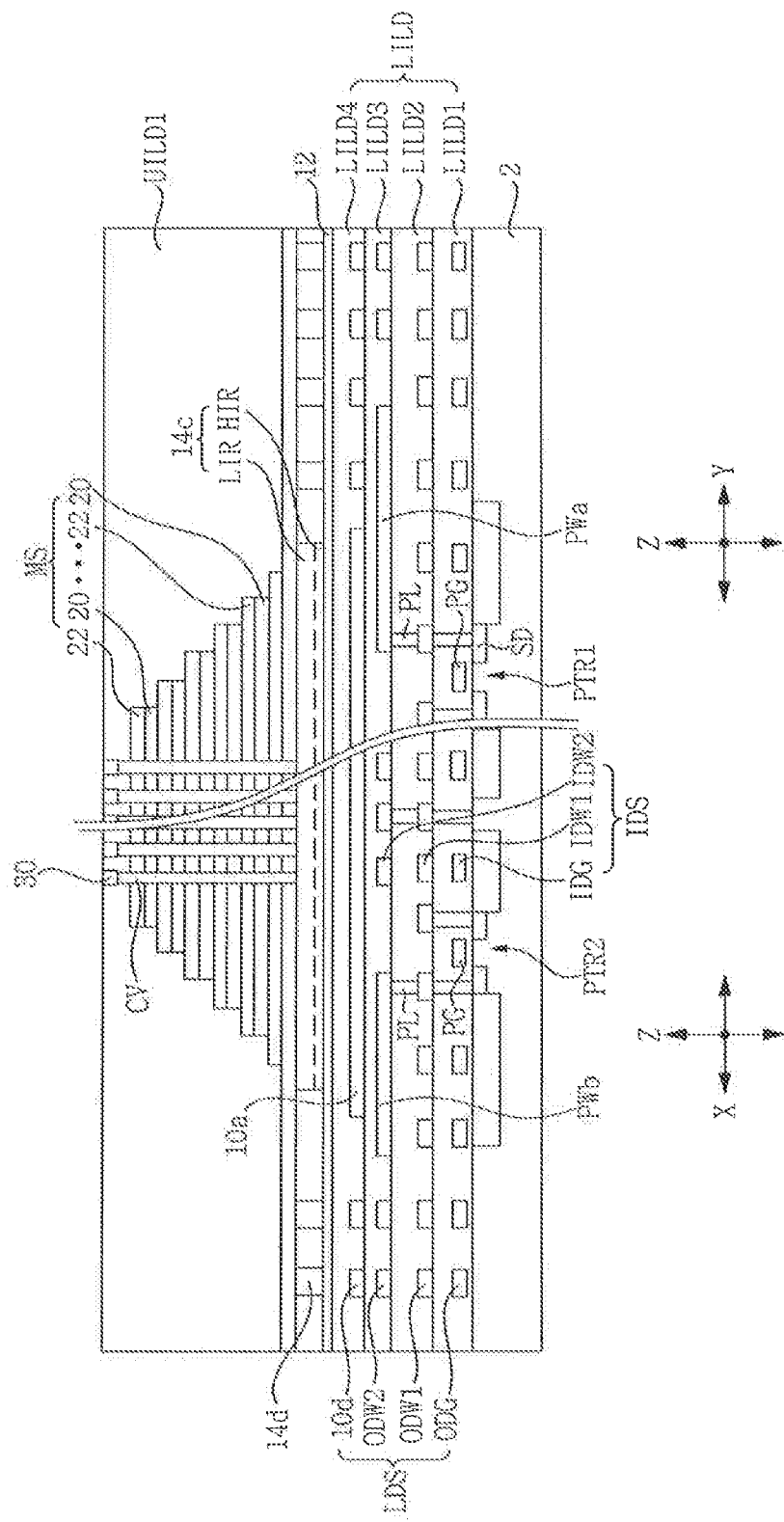

Referring to FIG. 9E, a first upper interlayer insulating layer UILD1 may be formed on the semiconductor substrate 2 including the molding structure MS. The first upper interlayer insulating layer UILD1 may be formed of silicon oxide. The first upper interlayer insulating layer UILD1 may cover the molding structure MS and have a substantially planar upper surface.

Cell vertical structures CV passing through the molding structure MS may be formed on the semiconductor substrate 2. The cell vertical structures CV may be formed on the cell semiconductor pattern 14c. The cell vertical structures CV may pass through the first upper interlayer insulating layer UILD1 and the molding structure MS to be electrically connected to the cell semiconductor pattern 14c.

Each of the cell vertical structures CV may include a first cell dielectric layer (reference numeral 27 of FIG. 1B), a cell semiconductor layer (reference numeral 28 of FIG. 1B), a core insulating pattern (reference numeral 29 of FIG. 1B), and a cell pad pattern 30. For example, the formation of the cell vertical structures CV may include forming holes (reference numeral H of FIG. 1B) passing through the first upper interlayer insulating layer UILD1 and the molding structure MS, forming the first cell dielectric layers (reference numeral 27 of FIG. 1B) on sidewalls of the holes (reference numeral H of FIG. 1B), conformally forming the cell semiconductor layers 28 on the semiconductor substrate 2 on which the first cell dielectric layers (reference numeral 27 of FIG. 1B) are formed, forming the core insulating patterns (reference numeral 29 of FIG. 1B) partially filling the holes (reference numeral H of FIG. 1B) on the cell semiconductor layers 28, forming pad layers on the semiconductor substrate 2 including the core insulating patterns (reference numeral 29 of FIG. 1B), and forming the cell pad patterns 30 and the cell semiconductor layers (reference numeral 28 of FIG. 1B) in the holes (reference numeral H of FIG. 1B) by planarizing the pad layers and the cell semiconductor layers 28 until the first upper interlayer insulating layer UILD1 is exposed.

The cell semiconductor layer (reference numeral 28 of FIG. 1B) may be connected to the cell semiconductor pattern 14c. The cell semiconductor layer (reference numeral 28 of FIG. 1B) and the cell pad pattern 30 may be formed of silicon. For example, the cell semiconductor layer (reference numeral 28 of FIG. 1B) and the cell pad pattern 30 may be formed of polysilicon.

The formation of the first cell dielectric layer (reference numeral 27 of FIG. 1B) a include forming a data storage material layer (e.g., a silicon nitride layer capable of trapping charges) and a tunnel oxide layer (e.g., a silicon oxide layer). The cell pad pattern 30 may be formed to have an n-type conductivity using an ion-implantation process.

Figure 9F:
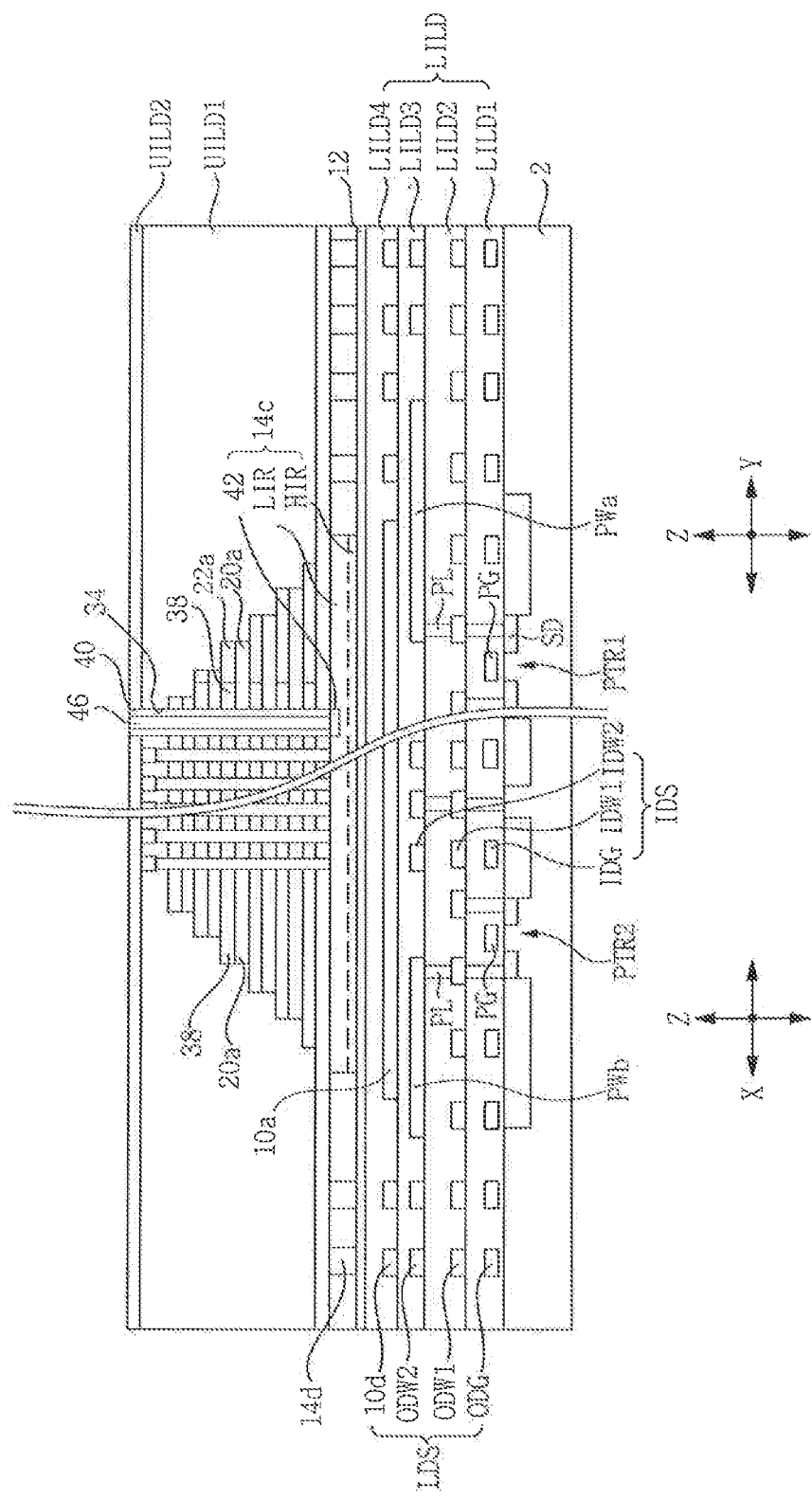

Referring to FIG. 9F, a second upper interlayer insulating layer UILD2 may be formed on the semiconductor substrate 2 including the cell vertical structures CV. The second upper interlayer insulating layer UILD2 may be formed of silicon oxide.

Trenches 34 passing through the first and second upper interlayer insulating layers UILD1 and UILD2 and the molding structure (reference numeral MS of FIG. 9E) and crossing the molding structure (reference numeral MS of FIG. 9E) may be formed on the cell semiconductor pattern 14c.

In an exemplary embodiment of the inventive concept, the trenches 34 may be formed in a line shape elongated in a first direction X.

Empty spaces may, be formed by etching the second molding layer (reference numeral 22 of FIG. 9E) exposed by the trenches 34. A second cell dielectric layer (reference numeral 37 of FIG. 1B) and cell gate conductive patterns 38, filling the empty spaces, may be sequentially formed. The information of the second cell dielectric layer (reference numeral 37 of FIG. 1B) and the cell gate conductive patterns 38 may include conformally forming a second dielectric material on the semiconductor substrate 2 including the empty spaces, forming a conductive material layer, and removing the conductive material layer formed on the second upper interlayer insulating layer UILD2 and in the trenches 34 by using an etching process.

In an exemplary embodiment of the inventive concept, the first and second molding layers 20 and 22 in a staircase area of the molding structure (reference numeral MS of FIG. 9E) disposed in the second direction Y intersecting the line-shaped trenches 34 may remain to form first and second molding patterns 20a and 22a. Accordingly, the cell gate conductive patterns 38 may be formed in the staircase area disposed in the first direction X, and the first and second molding patterns 20a and 22a may be formed in the staircase area disposed in the second direction Y perpendicular to the first direction X.

The first molding layer 20 remaining between the cell gate conductive patterns 38 may be a cell interlayer insulating layer (reference numeral 20a of FIG. 18).

Insulating spacers 40 may be formed on sidewalls of the trenches 34. The insulating spacers 40 may be formed of an insulating material, such as silicon oxide or silicon nitride.

A cell source impurity region 42 may be formed in the cell semiconductor pattern 14c exposed by the trenches 34 by performing an ion-implantation process. The cell source impurity region 42 may have a different conductivity type than the low concentration impurity region LIR. For example, the low concentration impurity region LIR may have a p-type conductivity, and the cell source impurity region 42 may have an n-type conductivity.

Cell source patterns 46 may be formed in the trenches 34. The cell source patterns 46 may be formed of a conductive material (e.g., Ti, TiN, or W).

Referring to FIG. 9G, a third upper interlayer insulating layer UILD3 may be formed on the semiconductor substrate 2 including the cell source patterns 46. The third upper interlayer insulating layer UILD3 may be formed of silicon oxide.

A first peripheral lower contact plug 52a, a second peripheral lower contact plug 52b, a ground lower contact plug 54, cell gate lower contact plugs 56, a body contact plug 51, and peripheral lower contact dummy plugs 58 may be formed on the semiconductor substrate 2.

The cell gate lower contact plugs 56 may be formed on the staircase area of the cell gate conductive patterns 38. The cell gate lower contact plugs 56 may pass through the first to third upper interlayer insulating layers UILD1 to UILD3 and may be electrically connected to the cell gate conductive patterns 38.

The first peripheral lower contact plug 52a, the second peripheral lower contact plug 52b, the ground lower contact plug 54, and the peripheral lower contact dummy plugs 58 may be formed at outer sides of the cell semiconductor pattern 14c. In other words, the contact plugs 52a, 52b, 54 and 58 may not overlap the cell semiconductor pattern 14c.

The first peripheral lower contact plug 52a may pass through the first to third upper interlayer insulating layers UILD1 to UILD3, the bugger insulating layer 12, and the third and fourth lower interlayer insulating layers LILD3 and LILD4 and may be electrically connected to the first peripheral upper interconnection structure PWa.

The second peripheral lower contact plug 52b may pass through the first to third upper interlayer insulating layers UILD1 to UILD3, the buffer insulating layer 12, and the third and fourth lower interlayer insulating layers LILD3 and LILD4 and may be electrically connected to the second peripheral upper interconnection structure PWb.

The ground lower contact plug 54 may pass through the first to third upper interlayer insulating layers UILD1 to UILD3, the buffer insulating layer 12, and the fourth lower interlayer insulating layer LILD4 and may be electrically connected to a contact area of the conductive shielding pattern 10a.

The body contact plug 31 may pass through the first to third upper interlayer insulating layers UILD1 to UILD3 and may be connected to the cell semiconductor pattern 14c.

In an exemplary embodiment of the inventive concept, the body contact plug 51 may pass through the first to third upper interlayer insulating layers UILD1 to UILD3 and a plurality of the first and second insulating patterns 20a and 22a and may be connected to the cell semiconductor patter 114c.

The peripheral lower contact dummy plugs 58 may pass through the first to third upper interlayer, insulating layers UILD1 to UILD3. The peripheral lower contact dummy plugs 58 may pass through the first to third upper interlayer insulating layers UILD1 to UILD3 and may be disposed on the semiconductor dummy patterns 14d. The peripheral lower contact dummy plugs 58 may pass through the first to third upper interlayer insulating layers UILD1 to UILD3 to be connected to the semiconductor dummy patterns 14d.

In an exemplary embodiment of the inventive concept, the formation of the plugs 52a, 52b, 54, 56, and 58 may include forming holes in which to form the plugs 52a, 52b, 54, 56, and 58, implanting ions in areas exposed by the holes, and filling the boles with a conductive material Due to the ion implantation, a cell body contact impurity region 50 may be formed in the cell semiconductor pattern 14c below the body contact plug 51. The cell body contact impurity region 50 may have the same conductivity type as the low concentration impurity region LIR and a lower impurity concentration than the low concentration impurity region LIR.

A fourth upper interlayer insulating layers UILD4 may be formed on the third upper interlayer insulating layer UILD3. The fourth upper interlayer insulating layer UILD4 may be formed of silicon oxide.

Cell bit line contact plugs 60, a first peripheral upper contact plug 62a, a second peripheral upper contact plug 62b, a ground upper contact plug 64, cell gate upper contact plugs 66, and peripheral upper contact dummy plugs 68 may be formed.

The cell bit line contact plugs 60 may pass through the second to fourth upper interlayer insulating layers UILD2 to UILD4 and may be electrically connected to the cell pad patterns 30 (or, cell contact pads) of the cell vertical structures CV. The first peripheral upper contact plug 62a may pass through the fourth upper interlayer insulating layer UILD4 and may be electrically connected to the first peripheral lower contact plug 52a. The first peripheral lower contact plug 52a the first peripheral upper contact plug 62a may configure a first peripheral contact structure 72a. The second peripheral upper contact plug 621 may pass through the fourth upper interlayer insulating layer UILD4 and may be electrically connected to the second peripheral lower contact plug 52b. The second peripheral lower contact plug 52b and the second peripheral upper contact plug 6b may configure a second peripheral contact structure 72b. The ground upper contact plug 64 may pass through the fourth upper interlayer insulating layer UILD4 and may be electrically connected to the ground lower contact plug 54. The ground lower contact plug 54 and the ground upper contact plug 64 may configure a ground contact structure 74. The cell gate upper contact plugs 66 may pass through the fourth upper interlayer insulating layer UILD4 and may be electrically connected to the cell gate lower contact plugs 56. The cell gate lower contact plugs 56 and the cell gate upper contact plugs 66 may configure a cell gate contact structure 76. The peripheral upper contact dummy plugs 68 may pass through the fourth upper interlayer insulating layer UILD4 and may be electrically connected to the peripheral lower contact dummy plugs 58. The peripheral lower contact dummy plugs 58 and the peripheral upper contact dummy plugs 68 may configure a peripheral dummy contact structure 78.

A hit line 82a, a second peripheral interconnection 82b, a ground interconnection 84, a cell gate interconnection 86, and a peripheral interconnection dummy structure 88 may be formed on the fourth upper interlayer insulating layer UILD4.

The bit line 82a may be electrically connected to the cell bit line contact plugs 60 and the first peripheral contact structure 72a. Accordingly, the bit line 82a may electrically connect the cell pad pattern 30 of the cell vertical structure CV to the first peripheral circuit PTR1. The second peripheral interconnection 82b may be electrically connected to the second peripheral contact structure 72b. The ground interconnection 84 may be electrically connected to the ground contact structure 74. The cell gate interconnection 86 may be electrically connected to the cell gate contact structure 76. The peripheral interconnection dummy structure 88 may be connected to the peripheral dummy contact structure 78. The peripheral interconnection dummy structure 88 and the peripheral dummy contact structure 78 may configure an upper outer dummy structure UDS.

Referring again to FIG. 1A, a fifth upper interlayer insulating layer UILD5 may be formed on the fourth upper interlayer insulating layer UILD4.

A first contact plug 90a electrically connected to the cell gate interconnection 86, and a second contact plug 90b electrically connected to the second peripheral interconnection 82b, passing through the fifth upper interlayer insulating layer UILD5, may be formed on the semiconductor substrate 2.

A word line interconnection structure 92 electrically connected to the first and second contact plugs 90a and 90b may be formed on the fifth upper inter layer insulating layer UILD5. Accordingly, the word line interconnection structure 92 may electrically connect the cell gate conductive pattern 38, in other words, a word line to the second peripheral circuit PTR2.

Figure 10:
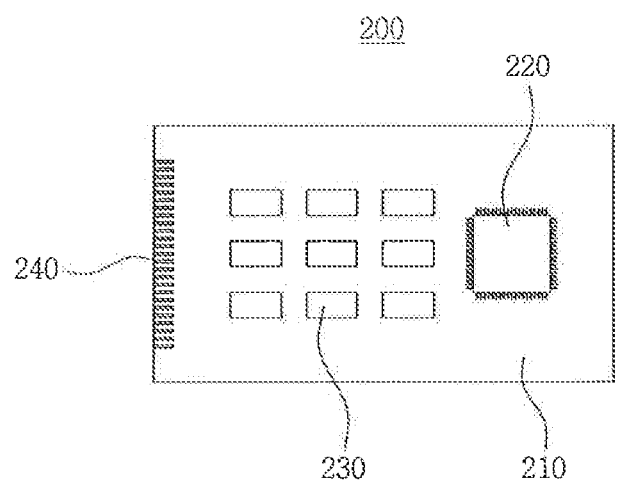
FIG. 10 is a diagram illustrating a semiconductor module in accordance with an exemplary embodiment of the inventive concept.

FIG. 10 is a schematic view of a semiconductor module 200 in accordance with an exemplary embodiment of the inventive concept.

Referring to FIG. 10, the semiconductor module 200 may include a memory device 230 formed on a module substrate 210. The semiconductor module 200 may include a semiconductor device 220 mounted on the module substrate 210.

The memory device 230 may include a semiconductor device in accordance with an exemplary embodiment of the inventive concept. Input/output terminals 240 may be arranged on at least one side of the module substrate 210.

Figure 11:
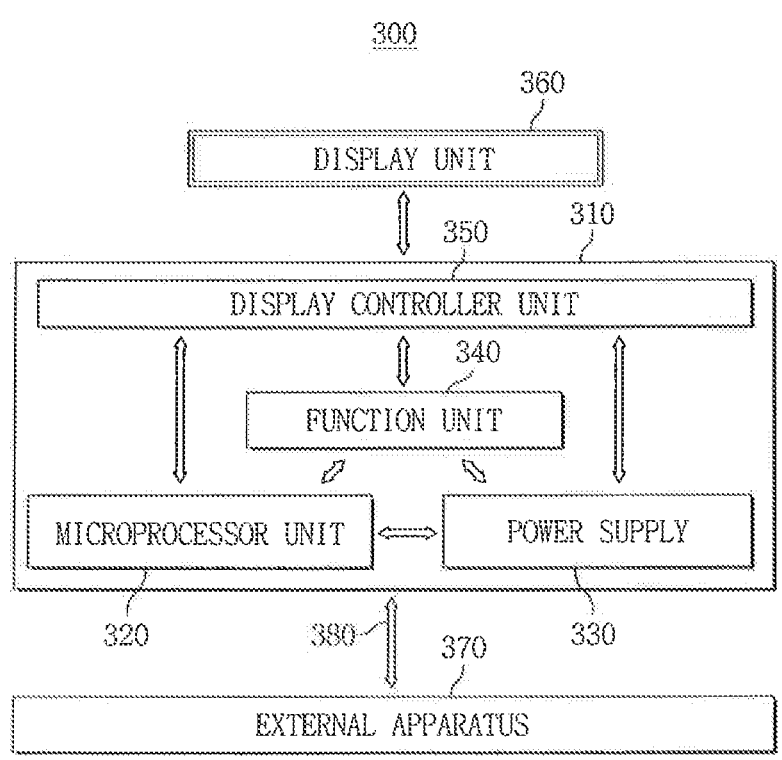
FIG. 11 is a block diagram illustrating an electronic system in accordance with an exemplary embodiment of the inventive concept.

FIG. 11 is a block diagram illustrating an electronic system 300 in accordance with an exemplary embodiment of the inventive concept.

Referring to FIG. 11, the electronic system 300 including a semiconductor device in accordance with an exemplary embodiment of the inventive concept may be provided.

The electronic system 300 may include a body 310. The body 310 may include a microprocessor unit 320, a power supply 330, a function unit 340, and/or a display controller unit 350. The body 310 may be a system board or a motherboard including a printed circuit board (PCB).

The microprocessor unit 320, the power supply 330, the function unit 340, and the display controller unit 350 may be installed or mounted on the body 310. A display unit 360 may be disposed on an upper surface or an outside of the body 310. For example, the display unit 360 may be disposed on a surface of the body 310 and display an image processed by the display controller unit 350. The power supply 330 may receive a constant voltage from an external power source, etc., divide the voltage into various levels of voltages, and supply those voltages to the microprocessor unit 320, the function unit 340, and the display controller unit 350, etc. The microprocessor unit 320 may receive a voltage from the power supply 330 to control the function unit 340 and the display unit 360. The function unit 340 may perform various functions of the electronic system 300.

The function unit 340 may perform various functions of the electronic system 300. For example, when the electronic system 300 is a mobile electronic apparatus, such as a mobile phone, the function unit 340 may have several components which perform wireless communication functions such as output of an image to the display unit 360 or output of a voice to a speaker, by dialing or communication with an external apparatus 370. When a camera is installed, the function unit 340 may function as a camera image processor.

In an exemplary embodiment of the inventive concept, when the electronic system 300 is connected to a memory card, etc., to expand a capacity thereof, the function unit 340 may be a memory card controller. The function unit 340 may exchange signals with the external apparatus 370 through a wired or wireless communication unit 380.

Further, when the electronic system 300 uses a Universal Serial Bus (USB) etc., to expand functionality, the function unit 340 may serve as an interface controller.

Figure 12:
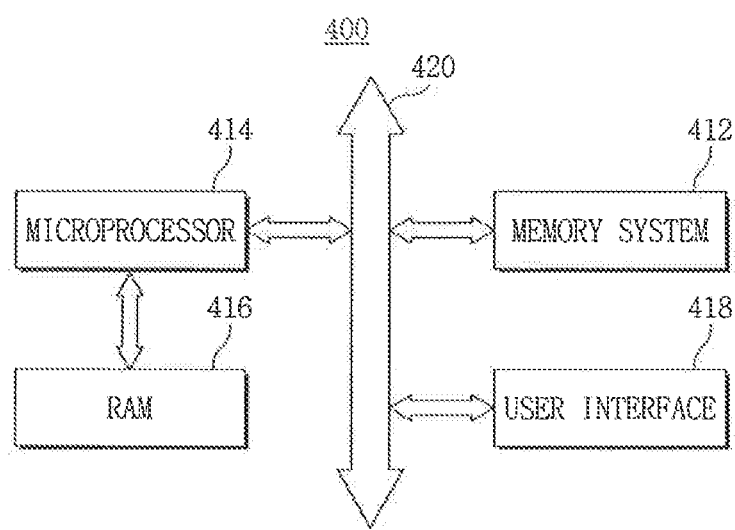
FIG. 12 is a block diagram illustrating an electronic system in accordance with an exemplary embodiment of the inventive concept.

FIG. 12 is a block diagram illustrating an electronic system 400 in accordance with an exemplary embodiment of the inventive concept.

Referring to FIG. 12, the electronic system 400 may include a semiconductor device in accordance with art exemplary embodiment of the inventive concept. The electronic system 400 may include a memory system 412, a microprocessor 414, a random access memory (RAM) 416, and a user interface 418 performing data communication using a bus 420. The microprocessor 414 may program and control the electronic system 400. The RAM 416 may be used as an operational memory of the microprocessor 414. The microprocessor 414, the RAM 416, and/or other components may be assembled in a single package. The memory system 412 may include a semiconductor device in, accordance with an exemplary embodiment of the inventive concept.

The user interface 418 may be used to input data to or output data from the electronic system 400. The memory system 412 may store codes for operating the microprocessor 414, data processed by the microprocessor 414, or external input data. The memory system 412 may include a controller and a memory device.

According to exemplary embodiments of the inventive concept, a semiconductor device structure and a method of manufacturing the semiconductor device structure capable of increasing productivity may be provided.

According to exemplary embodiments of the inventive concept, a semiconductor device structure and method of manufacturing the semiconductor device structure capable of preventing crosstalk between peripheral circuits and cell array regions, vertically disposed, may be provided.

According to exemplary embodiments of the inventive concept, a cell semiconductor pattern may be disposed on a semiconductor substrate, and peripheral circuits and peripheral interconnection structures may be disposed between the semiconductor substrate and the cell semiconductor pattern.

An inner dummy structure may be disposed between the semiconductor substrate and the cell semiconductor pattern. Such an inner dummy structure may allow a lower interlayer insulating layer covering the semiconductor substrate as and the cell semiconductor pattern and configured with a plurality of layers to be planar. Accordingly, a semiconductor pattern disposed on the planar lower interlayer insulating layer having the planar upper surface may also have a planar upper surface. Since the upper surface of the semiconductor pattern is planar, a cell array region including a three-dimensional arrangement on the semiconductor pattern may be stably formed without process failure.

A conductive shielding pattern may be formed between the peripheral circuits and peripheral interconnection structures, and the cell semiconductor pattern on the semiconductor substrate. The conductive shielding pattern may prevent crosstalk between cell array regions disposed on the cell semiconductor pattern and peripheral circuits disposed under the cell semiconductor pattern.

An outer dummy structure and a semiconductor dummy pattern disposed on the semiconductor substrate away from the cell semiconductor pattern may prevent the dishing phenomenon from occurring due to a planarization process. Accordingly, since a layer has a more planar upper surface, upper patterns formed on the planar upper surface may be stably formed with no defects, and thus productivity may be increased.

While the inventive concept has been described with reference to exemplary embodiments thereof, it will be understood by those skilled in the art that various changes in form and detail may be made thereto without departing from the scope of the inventive concept as defined by the appended claims. For example, exemplary embodiments of the inventive concept may be applied to a finFET, a nanowire transistor, or a three-dimensional transistor.

What is claimed is:

1. A semiconductor device, comprising:
a semiconductor substrate;
a first pattern on the semiconductor substrate;
a second pattern disposed at substantially the same level as the first pattern and spaced apart from the first pattern;
a peripheral circuit on the semiconductor substrate, at least a portion of the peripheral circuit being between the semiconductor substrate and the first pattern;
a dummy interconnection structure on the semiconductor substrate;
a stacked structure including cell gate conductive patterns on the first pattern, the cell gate conductive patterns being stacked while being spaced apart from each other in a vertical direction perpendicular to an upper surface of the first pattern;
a cell vertical structure disposed on the first pattern and passing through the cell gate conductive patterns, wherein at least one side of the stacked structure has a staircase shape; and
a dummy contact plug directly on and contacting the second pattern,
wherein a portion of the cell vertical structure directly contacts the first pattern,
wherein an upper end of the dummy contact plug is at a higher level than an uppermost cell gate conductive pattern among the cell gate conductive patterns,
wherein a lower end of the dummy contact plug is at a lower level than a lowermost cell gate conductive pattern among the cell gate conductive patterns,
wherein the dummy interconnection structure is electrically isolated,
wherein the dummy interconnection structure includes dummy patterns disposed at different levels from each other with respect to an upper surface of the semiconductor substrate,
wherein the dummy patterns include:
a first dummy pattern; and
a second dummy pattern disposed at a higher than the first dummy pattern,
wherein the peripheral circuit includes:
a first peripheral interconnection pattern disposed at substantially the same level as the first dummy pattern; and
a second peripheral interconnection pattern disposed at substantially the same level as the second dummy pattern.

2. The semiconductor device of claim 1, wherein the first pattern and the second pattern include the same material.

3. The semiconductor device of claim 2, wherein the first pattern includes a first layer and a second layer on the first layer, and
wherein the second layer is different from the first layer.

4. The semiconductor device of claim 1, wherein each of the first pattern and the second pattern includes polysilicon.

5. The semiconductor device of claim 1, wherein the first pattern and the second pattern have substantially the same thickness.

6. The semiconductor device of claim 1, wherein the dummy patterns further include a dummy gate pattern,
wherein the peripheral circuit further includes a peripheral gate disposed at substantially the same level as the dummy gate pattern, and
wherein the dummy gate pattern is at a lower level than the first dummy pattern.

7. The semiconductor device of claim 6, wherein the dummy patterns further include a third dummy pattern disposed at a higher level than the second dummy pattern.

8. The semiconductor device of claim 7, wherein at least a portion of the third dummy pattern overlaps at least one of at least a portion of the first dummy pattern or at least a portion of the second dummy pattern in the vertical direction.

9. The semiconductor device of claim 1, wherein at least a portion of the second dummy pattern overlaps at least a portion of the first dummy pattern in the vertical direction.

10. The semiconductor device of claim 1, wherein the dummy contact plug is a single dummy contact plug electrically connected to the second pattern.

11. The semiconductor device of claim 1, wherein the cell vertical structure includes a channel layer, a first dielectric layer, a second dielectric layer and a data storage layer,
wherein the cell gate conductive patterns include word lines,
wherein the data storage layer is between the first dielectric layer and the second dielectric layer,
wherein the second dielectric layer is between the channel layer and the data storage layer, and
wherein the channel layer contacts the first pattern.

12. A semiconductor device, comprising:
a semiconductor substrate;
a first pattern on the semiconductor substrate;
a second pattern disposed at substantially the same level as the first pattern and spaced apart from the first pattern;
a peripheral circuit on the semiconductor substrate, at least a portion of the peripheral circuit being between the semiconductor substrate and the first pattern;
a dummy interconnection structure on the semiconductor substrate;
a stacked structure including cell gate conductive patterns on the first pattern, the cell gate conductive patterns being stacked while being spaced apart from each other in a vertical direction perpendicular to an upper surface of the first pattern;
a cell vertical structure disposed on the first pattern, passing through the cell gate conductive patterns, and directly contacting the first pattern; and
a dummy contact plug directly contacting the second pattern,
wherein an upper end of the dummy contact plug is at a higher level than an uppermost cell gate conductive pattern among the cell gate conductive patterns,
wherein a lower end of the dummy contact plug is at a lower level than a lowermost cell gate conductive pattern among the cell gate conductive patterns,
wherein at least one side of the stacked structure has a staircase shape,
wherein the dummy interconnection structure is electrically isolated,
wherein the dummy interconnection structure includes at least three dummy patterns disposed at different levels from each other with respect to an upper surface of the semiconductor substrate,
wherein the at least three dummy patterns include:
a dummy gate pattern;
a first dummy pattern disposed at a higher level than the dummy gate pattern; and
a second dummy pattern disposed at a higher level than the first dummy pattern, and wherein the peripheral circuit includes:
a peripheral gate disposed at substantially the same level as the dummy gate pattern;
a first peripheral interconnection pattern disposed at substantially the same level as the first dummy pattern; and
a second peripheral interconnection pattern disposed at substantially the same level as the second dummy pattern.

13. The semiconductor device of claim 12, wherein the first pattern and the second pattern include the same material and have substantially the same thickness.

14. The semiconductor device of claim 13, wherein the first pattern includes a first layer and a second layer on the first layer, and
wherein the second layer is different from the first layer.

15. The semiconductor device of claim 12, wherein each of the first pattern and the second pattern includes polysilicon.

16. The semiconductor device of claim 12, wherein at least a portion of the second dummy pattern overlaps at least one of at least a portion of the dummy gate pattern or at least a portion of the first dummy pattern in the vertical direction.

17. The semiconductor device of claim 12, further comprising:
a bit line; and
a bit line dummy contact plug between the bit line and the cell vertical structure,
wherein the cell vertical structure includes a channel layer, a first dielectric layer, a second dielectric layer and a data storage layer,
wherein the cell gate conductive patterns include word lines,
wherein the data storage layer is between the first dielectric layer and the second dielectric layer,
wherein the second dielectric layer is between the channel layer and the data storage layer, and
wherein the channel layer contacts the first pattern.

18. An electronic system, comprising:
a memory device; and
a processor to control the memory device,
wherein the memory device comprises:
a semiconductor substrate;
a first pattern on the semiconductor substrate;
a second pattern disposed at substantially the same level as the first pattern and spaced apart from the first pattern;
a peripheral circuit on the semiconductor substrate, at least a portion of the peripheral circuit being between the semiconductor substrate and the first pattern;
a dummy interconnection structure on the semiconductor substrate;
a stacked structure including cell gate conductive patterns on the first pattern, the cell gate conductive patterns being stacked while being spaced apart from each other in a vertical direction perpendicular to an upper surface of the first pattern;
a cell vertical structure disposed on the first pattern, passing through the cell gate conductive patterns, and directly contacting the first pattern; and
a dummy contact plug directly contacting the second pattern,
wherein an upper end of the dummy contact plug is at a higher level than an uppermost cell gate conductive pattern among the cell gate conductive patterns,
wherein a lower end of the dummy contact plug is at a lower level than a lowermost cell gate conductive pattern among the cell gate conductive patterns,
wherein at least one side of the stacked structure has a staircase shape,
wherein the dummy interconnection structure is electrically isolated,
wherein the dummy interconnection structure includes at least three dummy patterns disposed at different levels from each other with respect to an upper surface of the semiconductor substrate,
wherein the at least three dummy patterns include:
a dummy gate pattern;
a first dummy pattern disposed at a higher level than the dummy gate pattern; and
a second dummy pattern disposed at a higher level than the first dummy pattern, and
wherein the peripheral circuit includes:
a peripheral gate disposed at substantially the same level as the dummy gate pattern;
a first peripheral interconnection pattern disposed at substantially the same level as the first dummy pattern; and
a second peripheral interconnection pattern disposed at substantially the same level as the second dummy pattern.

19. The electronic system of claim 18, wherein the cell vertical structure includes a channel layer, a first dielectric layer, a second dielectric layer and a data storage layer,
wherein the cell gate conductive patterns include word lines,
wherein the data storage layer is between the first dielectric layer and the second dielectric layer,
wherein the second dielectric layer is between the channel layer and the data storage layer, and
wherein the channel layer contacts the first pattern.

20. The electronic system of claim 18, wherein at least a portion of the second dummy pattern overlaps at least one of at least a portion of the dummy gate pattern or at least a portion of the first dummy pattern in the vertical direction.

* * * * *